United States Patent [19]

Usami

[11] Patent Number: 5,237,214

[45] Date of Patent: Aug. 17, 1993

[54] HIGH SPEED LOGIC CIRCUIT AND SEMICONDUCTOR INTEGRATED CIRCUIT DEVICE INCLUDING VARIABLE IMPEDANCE TO PROVIDE REDUCED POWER CONSUMPTION

[75] Inventor: Mitsuo Usami, Ohme, Japan

[73] Assignee: Hitachi, Ltd., Tokyo, Japan

[21] Appl. No.: 929,917

[22] Filed: Aug. 17, 1992

Related U.S. Application Data

[63] Continuation of Ser. No. 669,642, Mar. 14, 1991, abandoned.

[30] Foreign Application Priority Data

Aug. 18, 1990 [JP] Japan .................................. 2-217640

[51] Int. Cl.⁵ .......................................... H03K 17/04
[52] U.S. Cl. .................................... 307/454; 307/443; 307/446
[58] Field of Search ............... 307/443, 446, 454–456, 307/479, 246

[56] References Cited

U.S. PATENT DOCUMENTS

| | | | |
|---|---|---|---|
| 4,585,955 | 4/1986 | Uchida | 307/442 X |
| 4,746,817 | 5/1988 | Banker et al. | 307/446 |
| 4,791,320 | 12/1988 | Kawata et al. | 307/446 |
| 4,999,523 | 3/1991 | Cham et al. | 307/447 X |
| 5,003,199 | 3/1991 | Chuang et al. | 307/446 |
| 5,006,731 | 4/1991 | Denda | 307/446 X |
| 5,021,687 | 6/1991 | Yarbrough et al. | 307/456 |
| 5,059,836 | 10/1991 | Lee et al. | 307/479 X |

FOREIGN PATENT DOCUMENTS 61-29216 2/1986 Japan .
61-228723 10/1986 Japan .
63-124615 5/1988 Japan .

Primary Examiner—David R. Hudspeth
Attorney, Agent, or Firm—Antonelli, Terry, Stout & Kraus

[57] ABSTRACT

A logic circuit comprising a phase divider circuit, a transistor receiving an inverted output from the phase divider circuit, and an active pull-down circuit coupled with an output terminal in connection with the transistor and adapted to be operated by a noninverted output from the phase divider circuit, in which the phase divider circuit is provided with a variable impedance circuit, which is coupled with the inverted output and of which the impedance is adapted to be varied according to the input signal.

37 Claims, 12 Drawing Sheets

FIG. 11
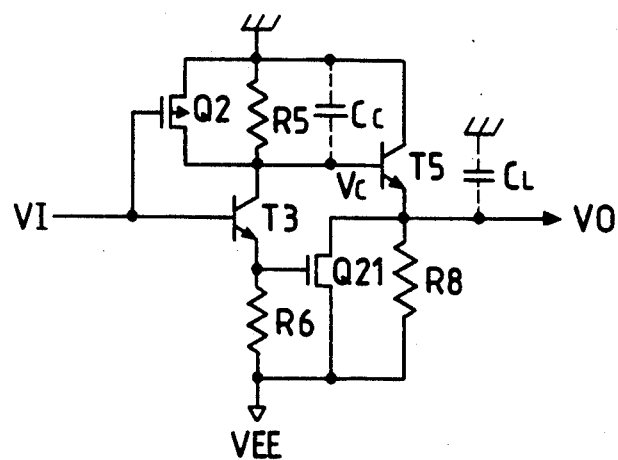
FIG. 12(A) VI
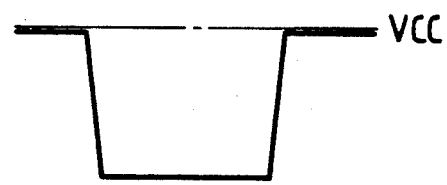
FIG. 12(B) Vc
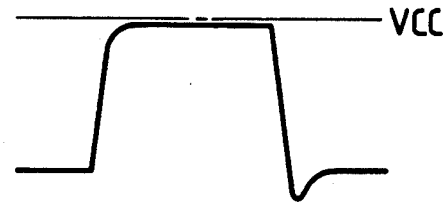

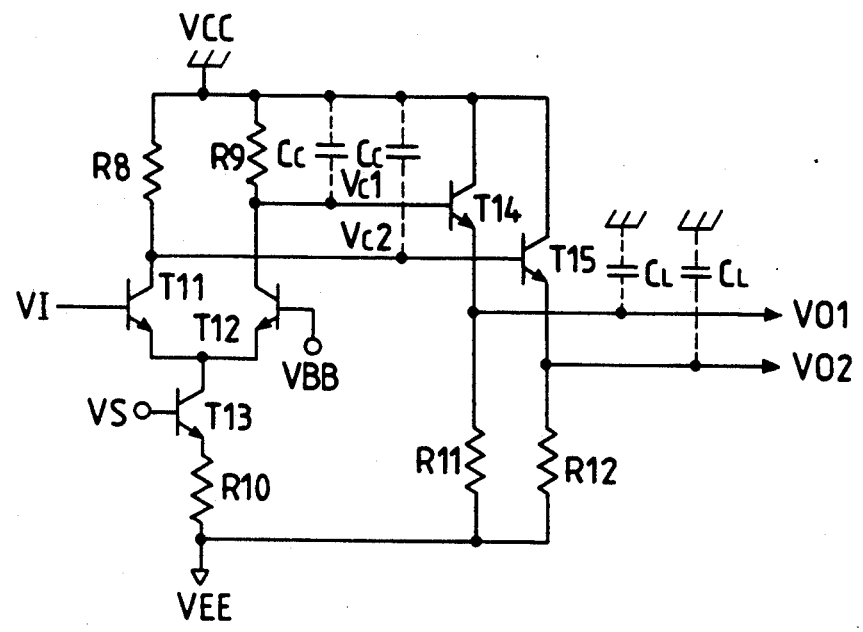
FIG. 23
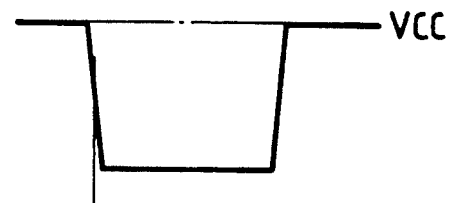
FIG. 24(A) VI
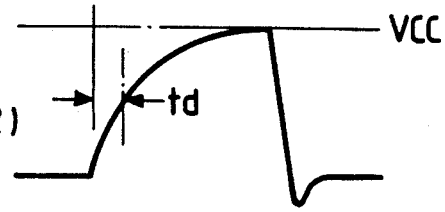
FIG. 24(B) Vc (Vc2)

HIGH SPEED LOGIC CIRCUIT AND SEMICONDUCTOR INTEGRATED CIRCUIT DEVICE INCLUDING VARIABLE IMPEDANCE TO PROVIDE REDUCED POWER CONSUMPTION

This is a continuation of application Ser. No. 669,642, filed Mar. 14, 1991 abandoned.

BACKGROUND OF THE INVENTION

The present invention relates to logic circuits and semiconductor integrated circuit device, and, more particularly, relates to arts especially effective for use in such circuits as Non Threshold Logic (hereinafter referred to as NTL) circuit, Super Push-pull Logic (hereinafter referred to as SPL) circuit, and Emitter Coupled Logic (hereinafter referred to as ECL) circuit and, further, in high-speed logical integrated circuit device with the above mentioned logic circuits employed as their basic constituents.

There is an NTL circuit receiving a digital input signal of a relatively small amplitude for performing high-speed logical operations. Also, there is a high-speed logical integrated circuit device with such NTL circuit used as its basic constituent and, further, a high-speed computer constituted of such high-speed logical integrated circuit device.

The NTL circuit includes, as illustrated in FIG. 21, a phase divider circuit formed of a bipolar transistor (hereinafter briefly referred to as "transistor") T1 receiving an input signal VI and its collector resistor R1 and emitter resistor R2 and, further, includes an output emitter-follower circuit for transmitting an inverted output signal of the phase divider circuit, i.e., the collector voltage Vc of the transistor T1, as an output signal VO of the circuit. In the NTL circuit, the input signal VI and output signal VO are set to have a relatively low amplitude as, for example, 0.6 V. As a result, the time required for charging and discharging the stray capacitance of each node or load capacitance is decreased and, accordingly, high-speed operation of the circuit as logic circuit can be attained.

In such NTL circuit, when the input signal VI is changed to the low level and the output signal VO is changed to the high level, the output-load capacitance $C_L$ coupled with the output terminal is actively charged through the output transistor T2. Hence, the change to the high level of the output signal VO is speeded up and, thus, the transmission delay time of the change to the low level of the input signal VI to the logic circuit is shortened. However, when the input signal VI is changed to the high level and the output signal VO is changed to the low level, the output-load capacitance $C_L$ is passively discharged through the emitter resistor R4 of the output transistor T2. As a result, the change of the output signal VO to the low level is delayed according to the time constant determined by the electrostatic capacity of the output-load capacitance $C_L$ and the resistance of the resistor R4. Thus, the transmission delay time of the change to the high level of the input signal VI to the logic circuit is prolonged.

To overcome such difficulty, the inventors, prior to the present invention, developed a so-called SPL circuit, which was obtained by replacing the resistor R4 in the above described NTL circuit with an active pull-down circuit, and finished the application for a patent for that invention.

The SPL circuit, as illustrated in FIG. 22, includes an active pull-down circuit having, in its center, a transistor T6 provided as the emitter load for an output transistor T5. The transistor T6 is supplied with a bias voltage of a value immediately before the voltage bringing the same into the on state, from a bias circuit formed of a transistor T4 and a resistor R7. Further, the base of the transistor T6 is supplied with the differential signal of the noninverted output signal of the phase divider circuit through a differential circuit formed of a capacitor C2 and the resistor R7. Thereby, the transistor T6 is temporarily turned on at the beginning of the change of the input signal VI to go high and the output-load capacitance $C_L$ is actively discharged through the transistor T6. As a result, the change of the output signal VO to go low is speeded up and the transmission delay time of the change going to the high level of the input signal VI to the logic circuit is shortened. Further, since the transistor T6 as the emitter load of the transistor T5 is normally held off and turned on temporarily only at the beginning of the change of the input signal VI to go high, the power consumption of the logic circuit can be extremely reduced.

As to the NTL circuit, there is a description, for example, in Japanese Laid-open Patent Publication No. 63-124615, and as to the SPL circuit, there are descriptions in the specification of patent application Ser. No. 330,461, filed in the U.S. Patent Office on Mar. 30, 1989, which issued on Mar. 12, 1991 into U.S. Pat. No. 4,999,520, and in the specification of continuation-in-part application Ser. No. 557,109, filed in the U.S. Patent Office on Jul. 25, 1990.

SUMMARY OF THE INVENTION

The present inventors, in the course of developing a high-speed logical integrated circuit device using the SPL circuit as described above and attaining higher degree of circuit integration and lower power consumption in the device, encountered with the following problems. That is, in the above described SPL circuit, there are normally flowing operating currents through the transistor T3 constituting the phase divider circuit and the transistor T4 constituting the bias circuit. Therefore, in order to further reduce the power consumption in the SPL circuit, it is required to increase the resistance values of the resistors R5 and R6 as well as R7 so that the current normally flowing through these transistors may be reduced. Of these resistors, the resistance value of the resistor R7 can be increased with little effect produced on the transmission delay time of the logic circuit, and the effect produced by the resistor R6 can be suppressed by providing it with, for example, a speed-up capacitor. However, as to the resistor R5, the product of its resistance value and the electrostatic capacity of the stray capacitance $C_C$ coupled with the collector of the transistor T3, i.e., the time constant, presents a problem. Especially, when, as illustrated in FIGS. 24(A) and (B), the inverted output signal of the phase divider circuit, i.e., the collector voltage $V_C$ of the transistor T3, is changed to the high level and the stray capacitance $C_C$ is passively discharged through the resistor R5, the rise of the collector voltage $V_C$ is slowed down and, thereby, the transmission delay time of the change to the low level of the input signal VI to the logic circuit is prolonged.

The electrostatic capacity of the stray capacitance $C_C$ has a value around 10 pF (picofarad) even if the higher degree of circuit integration and miniaturization of the device is advanced. Hence, assuming that the power consumption of the SPL circuit for one gate is 0.1 mW (milliwatt) and the resistance value of the collector resistor R5 is 20 KΩ (kiloohm), the rise period td of the collector voltage $V_C$ becomes as large as 140 ps (picosecond), approximately. This places a considerable restriction on shortening of the machine cycle of the high-speed computer and the like constituted of the high-speed logical integrated circuit apparatus and it leads to one factor making it difficult to attain higher degree of circuit integration of the high-speed logical integrated circuit device and lower power consumption of the device.

The problem as described above arises also in the NTL circuit shown in FIG. 21 and an ECL circuit as shown in FIG. 23, and because of this, a considerable restriction is placed on shortening of machine cycle in high-speed logical integrated circuit device having such logic circuit as its basic constituent and high-speed computers and the like constituted of such high-speed logical integrated circuit device, and higher degree of circuit integration and lower power consumption of the device are prevented from being promoted.

The inventors have found the above described facts.

An object of the present invention is to attain lower power consumption in NTL circuits, SPL circuits, and ECL circuits without impairing high-speed operation of the circuits.

Another object of the present invention is to attain higher degree of circuit integration and lower power consumption in high-speed logical integrated circuit device having such a circuit as NTL circuit, SPL circuit, or ECL circuit as its constituent, thereby attaining shorter machine cycle of high-speed computer or the like constituted of such high-speed logical integrated circuit device.

The above and other objects and novel features of the present invention will become more apparent from the description herein read in connection with the accompanying drawings.

Representative aspects of the invention herein disclosed are briefly described as follows. That is, a variable impedance means is employed as the collector load of the input transistor. The impedance of the variable impedance means is controlled so as to take a first value when the input transistor is to be brought into its conductive state and take a second value lower than the first value when the input transistor is to be brought into its nonconductive state.

More specifically, the above variable impedance means includes a switching means which is controlled for its operation by the input signal supplied to the input transistor and a level setting means. The switching means includes, for example, a transistor whose control terminal is adapted to receive the input signal. The level setting means includes, for example, a resistor element and/or a diode element.

With the described arrangement, the charging of the stray capacitance coupled with the collector node of the input transistor is speedily performed by the variable impedance means whose impedance is brought to the second value lower than the first value in response to the nonconductive state of the input transistor. On the other hand, the discharging of the stray capacitance is speedily performed by the input transistor in its conductive state, while the potential of the collector node is kept, by means of the impedance of the variable impedance means, at the first value higher than the second value so as to allow the input transistor to operate at its nonsaturation state. Hence, the charging and discharging of the collector node of the input transistor are speedily performed.

Thus, by applying the present invention to the circuit, lower power consumption of the NTL circuit, SPL circuit, and the ECL circuit can be attained without impairing high-speed operation of the circuit. Consequently, higher degree of circuit integration and lower power consumption of high-speed logical integrated circuit device and the like with such logic circuit used as the basic constituent can be achieved and, further, shorter machine cycle of the high-speed computers or the like constituted of such high-speed logical integrated circuit device can be obtained, and thus, miniaturization and lower power consumption of the computers can be attained.

BRIEF DESCRIPTION OF THE DRAWINGS

FIG. 11 is a particular circuit diagram showing a fourth embodiment of the SPL circuit based on the basic circuit diagram of FIG. 3;

FIG. 12(A) and FIG. 12(B) are signal waveform diagrams showing an example of the NTL circuit and SPL circuit of FIG. 1 to FIG. 11;

FIG. 23 is a circuit diagram showing an example of a conventional ECL circuit;

FIG. 24(A) and FIG. 24(B) are signal waveform diagrams showing an example of the NTL circuit, SPL circuit, and ECL circuit of FIG. 21 to FIG. 23;

DESCRIPTION OF THE PREFERRED EMBODIMENTS

Basic Structure of Logic Circuits

NTL Circuit and SPL Circuit

Figure 1:
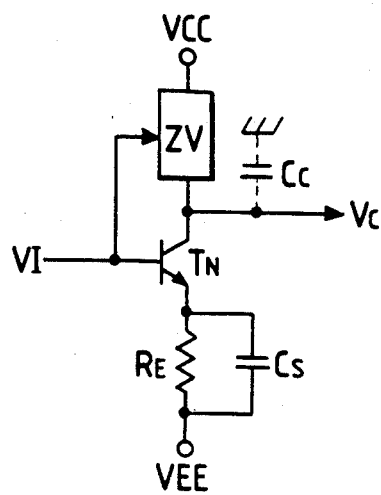
FIG. 1 is a partial, basic conceptual diagram showing a first embodiment of an NTL circuit and SPL circuit to which the present invention is applied.
Figure 2:
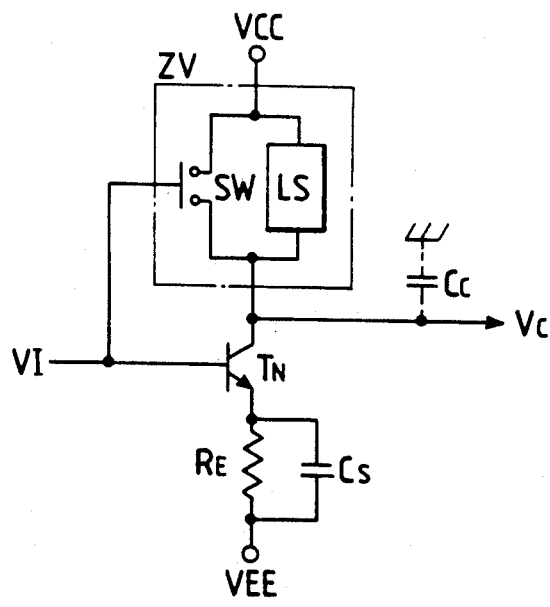
FIG. 2 is a partial, basic structural diagram showing an embodiment of the NTL circuit and SPL circuit of FIG. 1.
Figure 3:
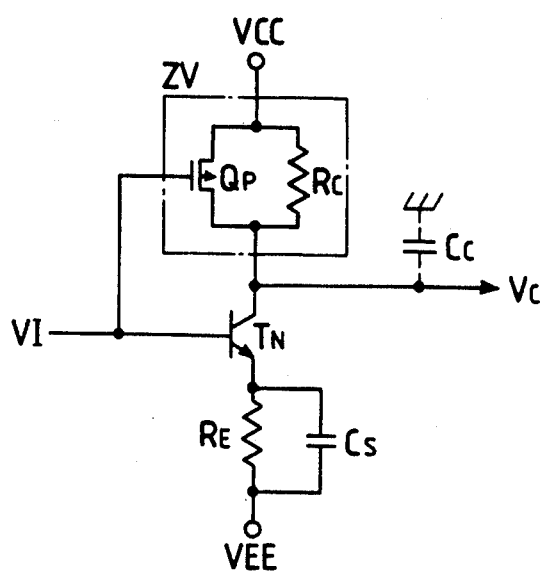
FIG. 3 is a partial, basic circuit diagram showing a first embodiment of the NTL circuit and SPL circuit of FIG. 2.
Figure 4:
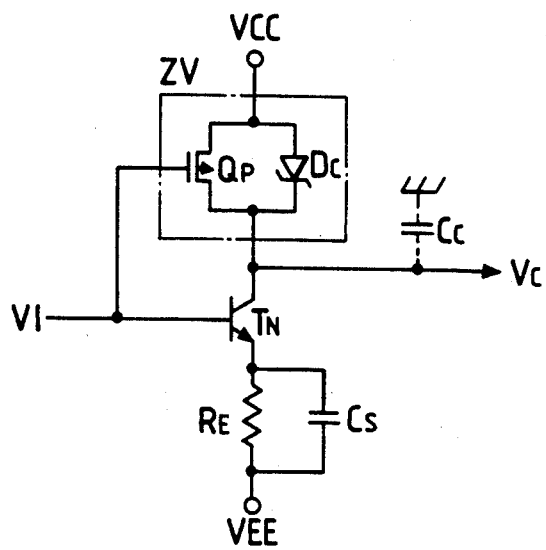
FIG. 4 is a partial, basic circuit diagram showing a second embodiment of the NTL circuit and SPL circuit of FIG. 2.
Figure 5:
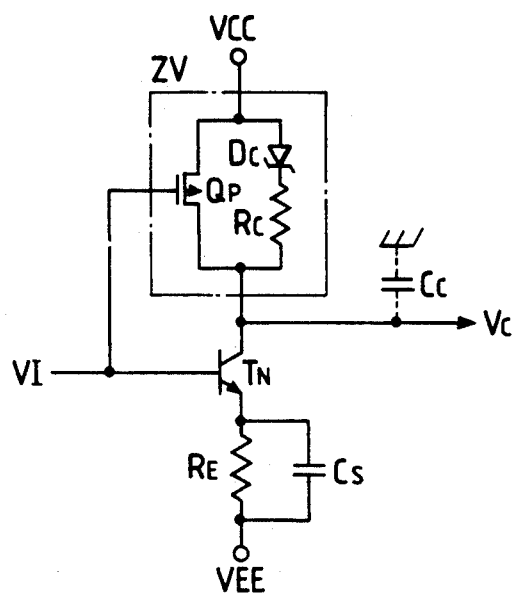
FIG. 5 is a partial, basic circuit diagram showing a third embodiment of the NTL circuit and SPL circuit of FIG. 2.

FIG. 1 shows a basic conceptual diagram of an NTL circuit and SPL circuit to which the present invention is applied. FIG. 2 shows a basic structural diagram of an embodiment of the NTL circuit and SPL circuit of FIG. 1. FIG. 3 to FIG. 5 show basic circuit diagrams of a first to a third embodiment of the NTL circuit and SPL circuit of FIG. 2, respectively, and FIG. 12(A) and FIG. 12(B) show an example of signal waveform diagram of the NTL circuit and SPL circuit of FIG. 1 to FIG. 5. With reference to these drawings, basic structures and characteristics of the NTL circuit and SPL circuit will be described below. Incidentally, FIG. 1 to FIG. 5 partially show the portion common to the NTL circuit and the SPL circuit, i.e., the portion related to the phase divider circuit portion.

Logic circuits shown in the following embodiments are, but not necessarily, mounted on a high-speed logical integrated circuit apparatus constituting a high-speed computer or the like. These logic circuits and circuit elements constituting the logic circuits are formed, but not necessarily, on one semiconductor substrate of such material as a single crystalline silicon, together with other logic circuits mounted on high-speed logical integrated circuit apparatus and its constituent circuit elements. In the following drawings, a MOSFET (metal-oxide-semiconductor field-effect-transistor; hereinafter "MOSFET" will be used as a generic name of insulated-gate field effect transistors) with an arrow attached to its channel (back gate) portion indicates a P-channel MOSFET and that with no arrow attached thereto indicates an N-channel MOSFET. Bipolar transistors shown, unless otherwise specified, are all NPN transistors.

Referring to FIG. 1, both the NTL circuit and the SPL circuit of the present embodiment are provided with a phase divider circuit including, but not necessarily, an NPN-type input transistor $T_N$ as their basic constituent. The base of this transistor $T_N$ is supplied with a predetermined input signal VI from a circuit, not shown, in the preceding stage of the high-speed logical integrated circuit apparatus. The input signal VI is a digital signal having, but not necessarily, a relatively small signal amplitude as 0.6 V, for example.

Between the power-supply voltage VCC on the high potential side (a first power-supply terminal supplied with a first power-supply voltage) and the collector of the input transistor $T_N$, there is provided a variable impedance means ZV. Between the collector of the transistor $T_N$ and the ground potential of the circuit, there is coupled stray capacitance $C_C$ on account of the base capacitance of the output transistor provided in the rear stage, relative wiring capacitance, and the like. On the other hand, between the emitter of the transistor $T_N$ and the power-supply voltage VEE on the low potential side (a second power-supply terminal supplied with a second power-supply voltage), there is provided an emitter resistor $R_E$ and, further, a predetermined speed-up capacitor $C_S$ in parallel with the emitter resistor $R_E$. The resistance value of the emitter resistor $R_E$ is set to a sufficiently large value so that the value of the operating current flowing through the phase divider circuit of the NTL circuit and SPL circuit in the normal conditions is kept lower than a predetermined value.

In the present embodiment, the impedance of the variable impedance means ZV is selectively varied according to the logical level of the corresponding input signal VI. More specifically, when the input signal VI is brought to the high level, the impedance of the variable impedance means ZV is set to be large enough to keep the operating current flowing through the transistor $T_N$ and the emitter resistor $R_E$ less than a predetermined amount. At this time, it becomes a necessary condition that the value of the impedance is such that will set the collector voltage $V_C$ of the transistor $T_N$ to a predetermined low level. It is meaningless if the impedance becomes infinite and an open-circuit state is thereby brought about. On the other hand, when the input signal VI is brought to the low level, the impedance of the variable impedance means ZV is set to a sufficiently small value so that the stray capacitance $C_C$ is quickly charged and the transmission delay time of the NTL circuit and SPL circuit is made shorter than a predetermined length of time. At this time, the impedance may be zero, thereby bringing about a short-circuit state. Thus, it is achieved to shorten the transmission delay time of the change to the low level and to the high level of the input signal VI to the NTL circuit and SPL circuit and to decrease the power consumption of the circuit.

The variable impedance means ZV shown in FIG. 1 is formed, but not necessarily, of a level setting means LS provided between the power-supply voltage VCC and the collector of the input transistor $T_N$ and a switching means SW provided in parallel with the level setting means LS, as shown in FIG. 2. Of these means, the switching means SW may be formed, as illustrated in FIG. 3 to FIG. 5, of one P-channel MOSFET $Q_P$ receiving the input signal VI at its gate. The level setting means LS may be formed, as shown in FIG. 3 and FIG. 4, of a collector resistor $R_C$ or a zener diode $D_C$ having a predetermined forward voltage, or, as shown in FIG. 5, of a series circuit of a collector resistor $R_C$ and a zener diode $D_C$. In these embodiments, the MOSFET $Q_P$ is designed, but not necessarily, to have a threshold voltage corresponding to the medium (e.g., average) value, approximately, of absolute values of the low level and the high level of the input signal VI.

When the input signal VI is changed to the high level, the switching means SW, i.e., the MOSFET $Q_P$, is brought into the off state and the input transistor $T_N$ is brought, substantially, to an on state. Therefore, the collector voltage $V_C$ of the transistor $T_N$ is, as illustrated in FIG. 12(B), set to a prescribed low level to be determined by the level setting means LS, i.e., the voltage drop across the collector resistor $R_C$ or the forward voltage of the zener diode $D_C$. Then, the electric charges charged on the collector stray capacitance $C_C$ of the transistor $T_N$ are actively discharged through the transistor $T_N$ having considerably large conductance. The speed-up capacitor $C_S$ provided in parallel with the emitter resistor $R_E$, then, has an effect to accelerate the discharging operation.

On the other hand, when the input signal VI is changed to the low level, the input transistor $T_N$ is brought, substantially, to a cutoff state and the MOSFET $Q_P$ is brought to an on state. Hence, the collector stray capacitance $C_C$ of the transistor $T_N$ is actively charged through the MOSFET $Q_P$ and the collector voltage $V_C$ is, thereby, quickly brought to the high level, such as power-supply voltage VCC illustrated in FIG. 12(B).

Figure 6:
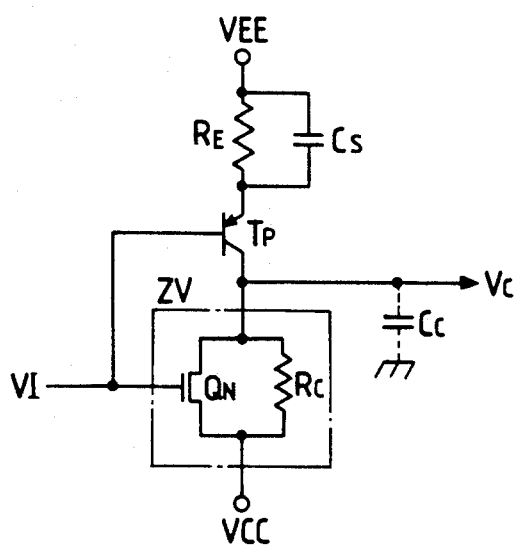
FIG. 6 is a partial, basic circuit diagram showing another embodiment of an NTL circuit and SPL circuit to which the present invention is applied.

FIG. 6 is a basic circuit diagram partially showing another embodiment of the NTL circuit and SPL circuit to which the present invention is applied.

Referring to FIG. 6, the phase divider circuit of the NTL circuit and SPL circuit includes a PNP-type input transistor $T_P$ as its basic constituent. Between the power-supply voltage VCC on the low potential side (a fist power-supply terminal supplied with a first power-supply voltage) and the collector of the transistor $T_P$, there is provided a level setting means formed of a collector resistor $R_C$ and, further, an N-channel MOSFET $Q_N$, having its gate supplied with the input signal VI, in parallel with the collector resistor $R_C$. On the other hand, between the emitter of the transistor $T_P$ and the power-supply voltage VEE on the high potential side (a second power-supply terminal supplied with a second power-supply voltage), there is provided an emitter resistor $R_E$ and, further, a predetermined speed-up capacitor $C_S$ in parallel with the emitter resistor $R_E$. Needless to say, the resistance values of the collector resistor $R_C$ and the emitter resistor $R_E$ are set to be sufficiently large so that the operating current of the NTL circuit and the SPL circuit in the normal condition is kept below a predetermined amount. The MOSFET $Q_N$ is designed so as to have a threshold voltage corresponding to the medium value, approximately, of the absolute values of the low level and the high level of the input signal VI.

When the input signal VI is brought to the low level, the MOSFET $Q_N$ is brought into the off state and the input transistor $T_P$ is brought, substantially, to an on state. Therefore, the collector voltage $V_C$ of the transistor $T_P$ is set to a prescribed high level to be determined by the voltage drop across the collector resistor $R_C$. Then, the electric charges charged on the collector stray capacitance $C_C$ of the transistor $T_P$ are actively discharged through the transistor $T_P$ having considerably large conductance, and by virtue of the provision of the speed-up capacitor $C_S$, the discharging operation is accelerated. On the other hand, when the input signal VI is changed to the high level, the input transistor $T_P$ is brought, substantially, to a cutoff state and the MOSFET $Q_N$ is brought to an on state. Hence, the collector stray capacitance $C_C$ of the transistor $T_P$ is charged to a negative potential through the MOSFET $Q_N$ and, thereby, the collector voltage $V_C$ is quickly brought to the low level as power-supply voltage VCC. Thus, also from the NTL circuit and SPL circuit of the present embodiment, the same effects as obtained from the NTL circuits and SPL circuits of the embodiments shown in FIG. 1 to FIG. 5 can be obtained.

ECL Circuit

Figure 13:
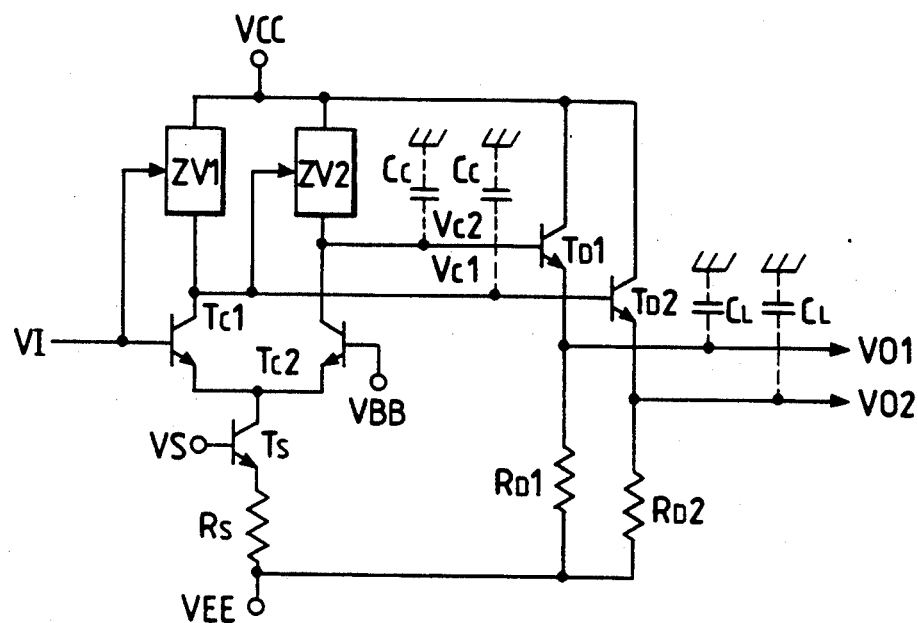
FIG. 13 is a basic conceptual diagram showing an ECL circuit to which the present invention is applied.

FIG. 13 shows a basic conceptual diagram of an embodiment of an ECL circuit to which the present invention is applied.

Referring to FIG. 13, the ECL circuit includes a current switching circuit having, but not necessarily, a pair of differential transistors $T_{C1}$ and $T_{C2}$ as its basic constituents. Of these transistors, one transistor $T_{C1}$ (input transistor) has its base supplied with the input signal VI and the other transistor $T_{C2}$ has its base supplied with a predetermined reference voltage VBB. The input signal VI has, but not necessarily, a relatively small signal amplitude as, for example, 0.8 V, and the reference voltage VBB is set to the medium potential, approximately, of the high level and the low level of the input signal VI.

Between the power-supply voltage VCC on the high potential side (a first power-supply terminal supplied with a first power-supply voltage) and the collectors of the transistors $T_{C1}$ and $T_{C2}$, there are provided, but not necessarily, predetermined variable impedance means ZV1 and ZV2, respectively. Between the collectors of the transistors $T_{C1}$ and $T_{C2}$ and the ground potential of the circuit, there are coupled stray capacitance $C_C$ on account of base capacitance of the output transistors $T_{D1}$ and $T_{D2}$ provided in the subsequent stage and related wiring capacitance, and the like. Between the emitters coupled in common of the transistors $T_{C1}$ and $T_{C2}$ and the power supply voltage VEE on the low potential side (a second power-supply terminal supplied with a second power-supply voltage), there is provided a constant-current source formed of a transistor $T_S$ receiving a predetermined constant voltage VS at its base and a resistor $R_S$. Thus, a current switching circuit having the reference voltage VBB as its logical threshold is formed of the above constant current source, the differential transistors $T_{C1}$ and $T_{C2}$, and the pair of variable impedance means ZV1 and ZV2.

The noninverted output signal of the current switching circuit, i.e., the collector voltage $V_{C2}$ of the transistor $T_{C2}$, is, but not necessarily, passed through an output emitter follower circuit formed of the transistor $T_{D1}$ and the resistor $R_{D1}$ to be thereby turned into the noninverted output signal VO1 of the ECL circuit. Meanwhile, the inverted output signal of the current switching circuit, i.e., the collector voltage $V_{C1}$ of the transistor $T_{C1}$, is passed through the other output emitter follower circuit formed of the transistor $T_{D2}$ and the resistor $R_{D2}$ to be thereby turned into the inverted output signal VO2 of the ECL circuit.

In the present embodiment, the impedance of the variable impedance means ZV1 is selectively varied according to the logical level of the corresponding input signal VI, whereas the impedance of the variable impedance means ZV2 is selectively varied, hut not necessarily, according to the inverted output signal of the corresponding current switching circuit, i.e., the level of the collector voltage Vc1 of the transistor $T_{C1}$. More specifically, when the input signal VI is changed to the high level, the impedance of the variable impedance means ZV1 is made large enough to make the operating current of the ECL circuit lower than a predetermined amount and obtain a predetermined low level at the collector of the transistor $T_{C1}$. At this time, by virtue of the change to the low level of the inverted output signal of the current switching circuit, i.e., the collector voltage Vc1 of the transistor $T_{C1}$, the impedance of the variable impedance means ZV2 is made small enough to quickly charge the corresponding stray capacitance $C_C$ to thereby bring the transmission delay in the ECL circuit less than a predetermined length of time. On the other hand, when the input signal VI is changed to the low level, the impedance of the variable impedance means ZV1 is made sufficiently small to quickly charge the corresponding stray capacitance $C_C$ to thereby make the transmission delay time of the ECL circuit shorter than a predetermined length of time. At this time, by virtue of the change to the high level of the inverted output signal of the current switching circuit, i.e., the collector voltage $V_{C1}$ of the transistor $T_{C1}$, the impedance of the variable impedance means ZV2 is made sufficiently large to make the operating current of the ECL circuit smaller than a predetermined amount and obtain a predetermined low level at the collector of the transistor $T_{C2}$. These performances, the same as in the several embodiments describe above, produce the effects to shorten the transmission delay time in responding to the change to the low level and the high level of the input signal VI to the ECL circuit and to reduce the power consumption thereof.

Particular Examples of Logic Circuits

NTL Circuit

Figure 7:
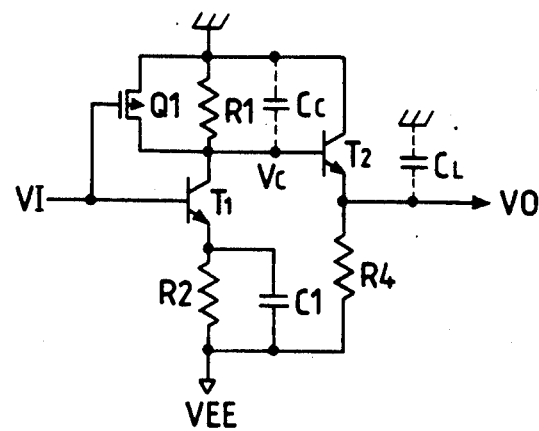
FIG. 7 is a particular circuit diagram showing an embodiment of the NTL circuit based on the basic circuit diagram of FIG. 3.

FIG. 7 shows a particular circuit diagram of an embodiment of the NTL circuit to which the present invention is applied. The NTL circuit according to the present embodiment is that based on the basic circuit shown in FIG. 3 and, hence, description of parts in FIG. 7 in common with those in FIG. 3 will be omitted. In the following particular circuit diagrams, the power-supply voltage VCC on the high potential side is set, hut not necessarily, to the ground potential of the circuit and the power-supply voltage VEE on the low potential side is set to a negative power-supply voltage, for example, at $-2.0$ V.

Referring to FIG. 7, the NTL circuit is provided with a phase divider circuit including, but not necessarily, a transistor T1 as its basic constituent. The transistor T1 corresponds to the input transistor $T_N$ in FIG. 3. Between the ground potential of the circuit and the collector of the transistor T1, there is provided a resistor R1 corresponding to the collector resistor $R_C$ in FIG. 3 and, further, a P-channel MOSFET $Q_1$ corresponding to the P-channel MOSFET $Q_P$ in FIG. 3 in parallel with the resistor R1. These resistor R1 and MOSFET $Q_1$ constitute a variable impedance means. Between the ground potential of the circuit and the collector of the transistor T1, there is further coupled a stray capacitance $C_C$. On the other hand, between the emitter of the input transistor T1 and the power-supply voltage VEE, there is provided a resistor R2 corresponding to the emitter resistor $R_E$ in FIG. 3 and, further, a capacitor C1 corresponding to the speed-up capacitor $C_S$ in FIG. 3 in parallel with the resistor R2.

In the present embodiment, the inverted output signal of the phase divider circuit, i.e., the collector voltage $V_C$ of the input transistor T1, is supplied, but not necessarily, to the base of an output transistor T2. The collector of the transistor T2 is coupled with the ground potential of the circuit and, between its emitter and the power-supply voltage VEE, there is provided an emitter resistor R4. These transistor T2 and resistor R4 constitute an emitter follower circuit and its output signal is supplied, as the output signal VO of the NTL circuit, to a circuit, not shown, in the subsequent stage of a high-speed logical integrated circuit apparatus. The output terminal VO of the NTL circuit is coupled with output-load capacitance $C_L$ on account of the input capacitance of a corresponding circuit in the subsequent stage and relative wiring capacitance.

When the input signal VI is changed to the high level $VI_H$, the MOSFET $Q_1$ is brought into the off state and the input transistor T1 is brought, substantially, into the on state. Hence, the resistor R1 allows to pass therethrough a collector current $I_C$ expressed as $$I_C \approx (VI_H - V_{BE}) / R2,$$

where $V_{BE}$ represents, and will also hereinafter represent, the base-emitter voltage of the NPN bipolar transistor. Accordingly, the collector voltage $V_C$ of the transistor T1 goes to a low level expressed as $$V_{CL} = I_C \times R1$$
$$\approx (VI_H - V_{BE})R1/R2.$$

Consequently, the output signal VO of the NTL circuit goes to a low level expressed as $$V_{OL} = V_{CL} - V_{BE}$$
$$\approx (VI_H - V_{BE})R1/R2 - V_{BE}.$$

At this time, the electric charges charged on the stray capacitance $C_C$ is actively discharged through the transistor T1 provided with relatively large conductance and this discharging operation is speeded up by virtue of the provision of the speed-up capacitor C1. The resistors R1 and R2 are set to have relatively large resistance values so that the operating current of the NTL circuit is reduced.

Meanwhile, when the input signal VI is changed to the low level $VI_L$, the input transistor T1 is brought into the cutoff state, substantially, and the MOSFET $Q_1$ is brought into the on state. Accordingly, the collector voltage $V_C$ of the transistor T1, because the ground potential of the circuit is supplied thereto through the MOSFET $Q_1$, goes to a high level expressed as $$V_{CH} \approx 0.$$

Consequently, the output signal VO of the NTL circuit goes to a high level expressed as $$V_{OH} = V_{CH} - V_{BE}$$
$$\approx -V_{BE}.$$

At this time, the stray capacitance $C_C$ of the transistor T1 is quickly charged through the MOSFET $Q_1$ and the rise of the output signal VO is thereby speeded up.

By the performances in the present embodiment, low power consumption of the NTL circuit can be attained without impairing the fast operation of the circuit, and besides, it becomes possible to advance higher degree of circuit integration and lower power consumption of high-speed logical integrated circuit apparatus with the NTL circuit mounted thereon.

SPL Circuit

Figure 8:
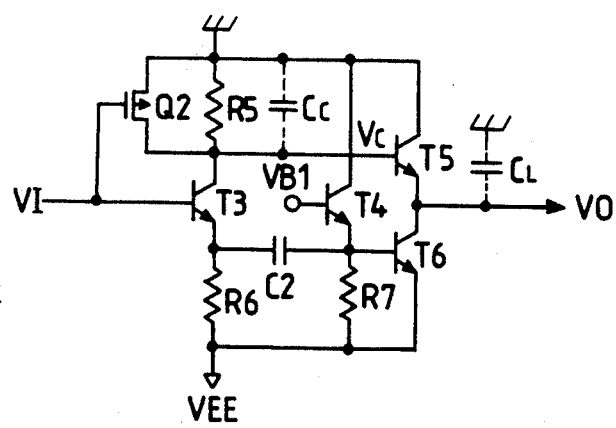
FIG. 8 is a particular circuit diagram showing a first embodiment of the SPL circuit based on the basic circuit diagram of FIG. 3.

FIG. 8 shows a particular circuit diagram of a first embodiment of an SPL circuit to which the present invention is applied. The present SPL circuit is that based on the basic circuit of FIG. 3 and, hence description of parts in FIG. 8 in common with those in FIG. 3 will be omitted.

Referring to FIG. 8, the SPL circuit is provided with a phase divider circuit including, but not necessarily, a transistor T3 as its basic constituent. The transistor T3 corresponds to the input transistor $T_N$ in FIG. 3 Between the ground potential of the circuit and the collector of the transistor T3, there is provided a resistor R5 corresponding to the collector resistor $R_C$ in FIG. 3 and, further, a P-channel MOSFET Q2 corresponding to the P-channel MOSFET $Q_P$ in FIG. 3 in parallel with the resistor R5. Such resistor R5 and MOSFET Q2 constitute a variable impedance means. Between the ground potential of the circuit and the collector of the transistor T3, there is further coupled a stray capacitance $C_C$. On the other hand, between the emitter of the input transistor T3 and the power-supply voltage VEE, there is provided a resistor R6 corresponding to the emitter resistor $R_E$ in FIG. 3. Needless to say, the resistance values of the resistors R5 and R6 are made sufficiently large to reduce the stationary operating current of the SPL circuit and set the collector voltage $V_C$ of the transistor T3 to a predetermined low level.

In the present embodiment, the inverted output signal of the phase divider circuit, i.e., the collector voltage $V_C$ of the input transistor T3, is supplied, but not necessarily, to the base of an output transistor T5. The collector of the transistor T5 is coupled with the ground potential of the circuit and, between its emitter and the power-supply voltage VEE, there is provided a transistor T6. The emitter and collector coupled in common of the transistors T5 and T6 is used as the output terminal VO of the SPL circuit and coupled with output-load capacitance on account of input capacitance of subsequent circuits and relative wiring capacitance. Thus, the transistor T6 operates as the emitter load of the output transistor T5 and it, together with the transistor T5, constitutes an emitter follower circuit and, on the other hand, operates as a pull-down element for the output-load capacitance $C_L$.

Between the ground potential of the circuit and the base of the transistor T6, there is provided, but not necessarily, a transistor T4 having its base supplied with a predetermined constant voltage VB1. Between the base of the transistor T6 and the power-supply voltage VEE, there is provided a resistor R7. The base of the transistor T6 is further coupled with the noninverted output node of the phase divider circuit, i.e., the emitter of the transistor T3, through a capacitor C2. Thus, the transistor T4 and the resistor R7 together constitute a bias circuit for the transistor T6 and supply the transistor T6 with a voltage immediately before the transistor T6 is brought into its on state, as the bias voltage. The capacitor C2 and the resistor R7 together constitute a differential circuit, which differentiates the noninverted output signal of the phase divider circuit and transmits the differential signal to the base of the transistor T6. The transistor T4, resistor R7, and the capacitor C2 together with the transistor T6 constitute an active pull-down circuit for the SPL circuit.

When the input signal VI is changed to the high level $VI_H$, the MOSFET Q2 is brought into the off state and the input transistor T3 is brought, substantially, into the on state. Hence, the resistor R5 allows to pass therethrough a collector current $I_C$ expressed as $$I_C \approx (VI_H - V_{BE}) / R6.$$

Accordingly, the collector voltage $V_C$ of the transistor T3 goes to a low level expressed as $$V_{CL} = I_C \times R5$$
$$\approx (VI_H - V_{BE})R5/R6.$$

At this time, the base of the transistor T6 is supplied, through the differential circuit formed of the capacitor C2 and resistor R7, with a positive pulse corresponding to the differential signal of the noninverted output signal of the phase divider circuit, whereby the transistor T6 is temporarily held in the on state. Thus, the transistor T6 acts as a low resistance load of the transistor T5 and also acts as the pull-down element drawing electric charges charged on the output-load capacitance $C_L$. Consequently, the output signal VO of the SPL circuit becomes a low level expressed as $$V_{OL} = V_{CL} - V_{BE}$$
$$\approx (VI_H - V_{BE})R5/R6 - V_{BE}.$$

When the output signal VO of the SPL circuit is changed to such low level, the electric charges charged on the output-load capacitance $C_L$ is quickly drawn through the transistor T6 as described above. Accordingly, the transmission delay time of the change to the high level of the input signal VI to the SPL circuit is greatly reduced. On the other hand, the resistance values of the resistors R5 and R6 constituting the phase divider circuit are set to be sufficiently large as described above. Further, the transistor T6 serving as the emitter load of the output transistor T5 is temporarily held on until the electric charges on the output-load capacitance $C_L$ have been drawn off and, then, the conductance is decreased. Consequently, the stationary operating current of the SPL circuit at the time when it outputs the low level is greatly reduced.

On the other hand, when the input signal VI is changed to the low level $VI_L$, the input transistor T3 is brought, substantially, into the cutoff state and the MOSFET Q2 is brought into the on state. Accordingly, the collector voltage $V_C$ of the transistor T3, because the ground potential of the circuit is supplied thereto through the MOSFET Q2, goes to a high level expressed as $$V_{CH} \approx 0.$$

At this time, the base of the transistor T6 is supplied, through the differential circuit formed of the capacitor C2 and resistor R7, with a negative pulse corresponding to the differential signal of the noninverted output signal of the phase divider circuit Therefore, the transistor T6 is quickly brought into the cutoff state to act as a high resistance load of the transistor T5. As a result, the output signal VO of the SPL circuit goes to a high level expressed as $$V_{OH} = V_{CH} - V_{BE}$$
$$\approx -V_{BE}.$$

When the output signal VO of the SPL circuit is changed to such high level, the collector stray capacitance $C_C$ of the transistor T3 is actively and quickly charged through the MOSFET $Q_2$ and the output-load capacitance $C_L$ is actively and quickly charged through the output transistor T5. Consequently, the transmission delay time of the change to the low level of the input signal VI to the SPL circuit is greatly reduced in spite of the large value of the resistance of the collector resistor $R_5$.

Owing to the above described performances in the present embodiment, low power consumption of the SPL circuit can be attained without impairing the fast operation of the circuit and, further, it becomes possible to advance higher degree of circuit integration and lower power consumption of high-speed logical integrated circuit apparatus with the SPL circuit mounted thereon.

Figure 9:
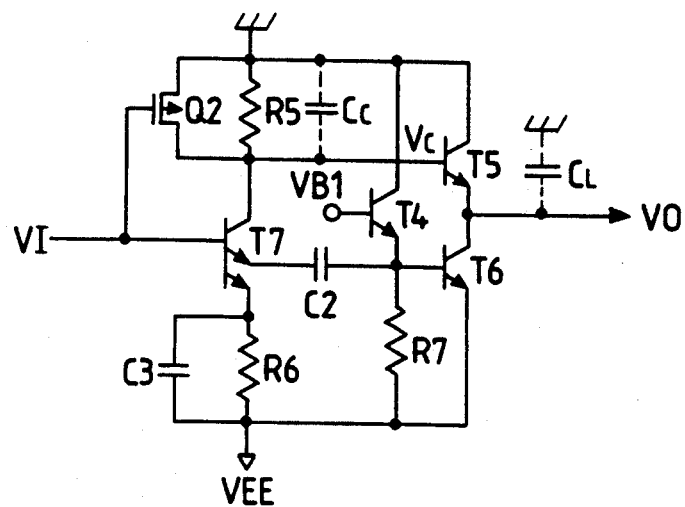
FIG. 9 is a particular circuit diagram showing a second embodiment of the SPL circuit based on the basic circuit diagram of FIG. 3.

FIG. 9 shows a particular circuit diagram of a second embodiment of an SPL circuit to which the present invention is applied. The SPL circuit of the present embodiment is that basically following the configuration of the embodiment of FIG. 8 and, hence, only parts differing from it will be additionally described below.

Referring to FIG. 9, an input transistor T7 of a double emitter type is used as the constituent of the phase divider circuit of the SPL circuit. On the collector side of the transistor T7, there is provided, the same as in the embodiment of FIG. 8, a variable impedance means formed of a collector resistor R5 and a P-channel MOSFET $Q_2$ and the inverted output signal of the phase divider circuit is transmitted to the output terminal VO of the SPL circuit through an output transistor T5. Between the output transistor T5 and the power-supply voltage VEE there is provided an active pull-down circuit having a transistor T6 in the center.

The first emitter of the input transistor T7 is connected, through, but not necessarily, a capacitor C2 constituting a differential circuit, with the base of the transistor T6. Between the second emitter of the input transistor T7 and the power-supply voltage VEE, there is provided an emitter resistor R6 and, further, a speed-up capacitor C3 in parallel with the emitter resistor R6. Needless to say, the resistance values of the collector resistor R6 and the emitter resistor R6 are made sufficiently large to reduce the stationary operating current of the SPL circuit and set the collector voltage $V_C$ of the transistor T7 to a predetermined low level.

From these performances in the SPL circuit according to the present embodiment, the same effects as obtained in the embodiment of FIG. 8 can be obtained as to the power consumption and the transmission delay time. Further, since the emitter with which the capacitor C2 constituting the differential circuit and the emitter with which the emitter resistor R6 is coupled are separated and, in addition, the emitter resistor R6 is coupled with the speed-up capacitor C3, the response of the phase divider circuit is enhanced and the transmission delay time of the SPL circuit can be reduced further.

Figure 10:
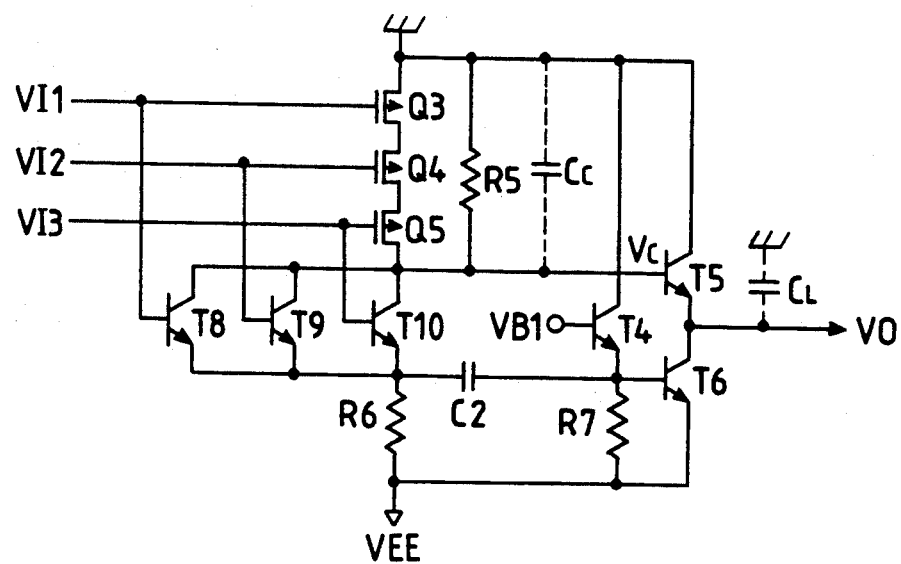
FIG. 10 is a particular circuit diagram showing a third embodiment of the SPL circuit based on the basic circuit diagram of FIG. 3.

FIG. 10 shows a particular circuit diagram of a third embodiment of an SPL circuit to which the present invention is applied The SPL circuit of the present embodiment is that basically following the configuration of the embodiment of FIG. 8 and, hence, only parts differing therefrom will be additionally described below.

Referring to FIG. 10, the phase divider circuit of the SPL circuit has three input transistors T8 to T10 connected in parallel as its basic constituents. Between the ground potential of the circuit and the collectors coupled in common of the input transistors, there is provided a collector resistor R5 and, further, a series circuit of three P-channel MOSFETs Q3 to Q6 connected in parallel with the resistor R5. The resistor R5 and MOSFETs Q3 to Q6 constitute a variable impedance means.

The inverted output signal of the phase divider circuit, i.e., the collector voltage $V_C$ of the collectors coupled in common of the input transistors T8 to T10, is transmitted to the output terminal TO of the SPL circuit through the output transistor T5. Between the emitter of the output transistor T5 and the power-supply voltage VEE, there is provided an active pull-down circuit having a transistor T6 in the center. On the other hand, the base of the input transistor T8 is coupled in common with the gate of the MOSFET Q3 and receives an input signal VI1 from a circuit, not shown, in the preceding stage of a high-speed logical integrated circuit apparatus. Likewise, the base of the input transistor T9 is coupled in common with the gate of the MOSFET Q4 and receives an input signal VI2 from a circuit, not shown, in the preceding stage of the high-speed logical integrated circuit apparatus. Further, the base of the input transistor T10 is coupled in common with the gate of the MOSFET Q5 and receives an input signal VI3 from a circuit, not shown, in the preceding stage of the high-speed logical integrated circuit apparatus. Here, the input signals VI1 to VI3 are all provided with a relatively small amplitude as, for example, 0.6 V.

When any of the input signals VI1 to VI3 is changed to the high level $VI_H$, the corresponding input transistor out of the input transistors T8 to T10 is brought, substantially, into the on state and the corresponding MOSFET out of the MOSFETs Q3 to Q6 is brought into the off state. Accordingly, the inverted output signal of the phase divider circuit, i.e., the collector voltage $V_C$, is brought, the same as in the embodiment of FIG. 8, to a predetermined low level expressed as $$V_{CL} \approx (VI_H - V_{BE}) R5 / R6,$$

and, thus the output signal VO of the SPL circuit goes to a low level expressed as $$VO_L \approx (VI_H - V_{BE}) R5 / R6 - V_{BE}.$$

At this time, the collector stray capacitance $C_C$ is quickly discharged through one of the input transistors T8 to T10 then held in the on state, and the output-load capacitance $C_L$ is quickly discharged through the transistor T6 then temporarily turned on.

When all of the input signals VI1 to VI3 are changed to the low level $VI_L$, the input transistors T8 to T10 are all brought, substantially, into the cutoff state and the MOSFETs Q3 to Q5 are simultaneously brought into the on state. Accordingly, the inverted output signal of the phase divider circuit, i.e., the collector voltage $V_C$, is brought to a high level expressed as $$V_{CH} \approx 0,$$

and, thus, the output signal VO of the SPL circuit goes to a high level expressed as $$VO_H \approx -V_{BE}.$$

At this time, the collector stray capacitance $C_C$ is actively and quickly charged through the MOSFETs Q3 to Q5 and the output-load capacitance $C_L$ is actively and quickly charged through the output transistor T5.

Through the described operations, the SPL circuit according to the present embodiment obtains the same effects as obtained in the embodiment of FIG. 8 and, further, functions as a three-input NOR gate circuit corresponding to a logical expression as $$VO = \overline{VI1 + VI2 + VI3}.$$

FIG. 11 shows a particular circuit diagram of a fourth embodiment of an SPL circuit to which the present invention is applied. The SPL circuit of the present embodiment is that basically following the configuration of the embodiment of FIG. 8 and, hence, only parts differing therefrom will be additionally described below.

Referring to FIG. 11, an input transistor T3, a variable impedance means, formed of a collector resistor R5 and a P-channel MOSFET Q2, and an emitter resistor R6, together, constitute a phase divider circuit. The inverted output signal of the phase divider circuit, i.e., the collector voltage $V_C$ of the transistor T3, is transmitted to the output terminal VO of the SPL circuit through the output transistor T5. Between the emitter of the output transistor T5 and the power-supply voltage VEE, there is provided an emitter load resistor R8 and, further, an N-channel MOSFET Q21 in parallel with the emitter load resistor R8. The gate of the MOSFET Q21 is coupled with the emitter of the input transistor T3. In the present case, the MOSFET Q21 is designed to have a threshold voltage corresponding to the medium value, approximately, of the values obtained by deducting the absolute value of the power-supply voltage VEE from the absolute values of the high level and low level of the noninverted output signal of the phase divider circuit, i.e., the emitter voltage of the input transistor T3.

When the input signal VI is changed to the high level $VI_H$, the input transistor T3 is brought into the on state, substantially, and the MOSFET Q2 is brought into the off state. Accordingly, the inverted output signal of the phase divider circuit, i.e., the collector voltage $V_C$ of the transistor T3, is brought to a predetermined low level, the same as in the embodiment of FIG. 8, expressed as $$V_{CL} \approx (VI_H - V_{BE}) R5 / R6.$$

Consequently, the output signal VO of the SPL circuit is brought to a low level expressed as $$VO_L \approx (VI_H - V_{BE}) R5 / R6 - V_{BE}.$$

At this time, the noninverted output signal of the phase divider circuit, i.e., the emitter voltage $V_E$ of the input transistor T3, is brought to a predetermined high level expressed as $$V_{EH} = VI_H - V_{BE}$$

and, thus, the MOSFET Q21 is brought into the on state. Therefore, the electric charges charged on the output-load capacitance $C_L$ are actively and quickly discharged through the MOSFET Q21 and, as a result, the transmission delay time of the change to the high level of the input signal VI to the SPL circuit is shortened.

On the other hand, when the input signal VI is changed to the low level $VI_L$, the input transistor T3 is brought into the cutoff state, substantially, and the MOSFET Q2 is brought into the on state. Accordingly, the collector voltage $V_C$ of the transistor T3 is brought to a high level expressed as $$V_{CH} \approx 0.$$

As a result, the output signal VO of the SPL circuit goes to a high level expressed as $$VO_H \approx -V_{BE}.$$

At this time, the noninverted output signal of the phase divider circuit, i.e., the emitter voltage $V_E$ of the input transistor T3, goes to a low level expressed as $$V_{EL} = VI_L - V_{BE},$$

and the MOSFET Q21 is thereby brought into the off state. The output-load capacitance $C_L$ is actively and quickly discharged through the output transistor T5 provided with relatively large conductance. Consequently, while the high-speed operation is achieved, the operating current of the output emitter circuit can be reduced and the power consumption thereof can be reduced.

ECL Circuit

Figure 14:
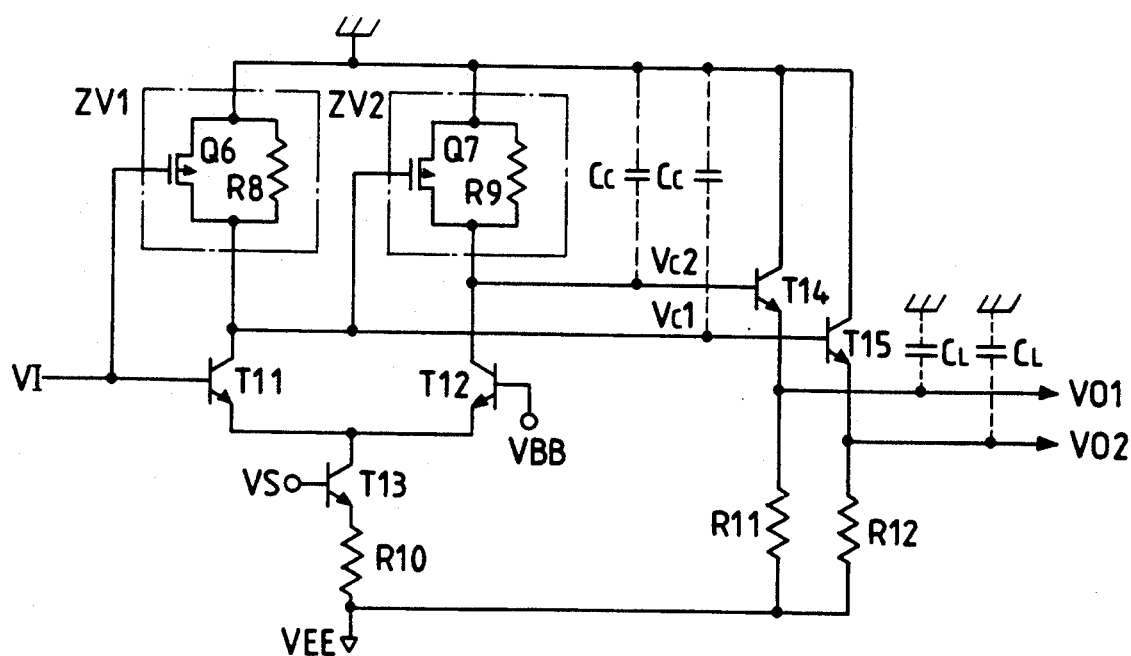
FIG. 14 is a particular circuit diagram showing an embodiment of the ECL circuit of FIG. 13.

FIG. 14 shows a particular circuit diagram of an embodiment of the ECL circuit to which the present invention is applied. The ECL circuit of the present embodiment is based on the basic circuit shown in FIG. 13 and description of the parts in FIG. 14 common with those in FIG. 13 will be omitted.

Referring to FIG. 14, the ECL circuit has a current switching circuit including, but not necessarily, a pair of differential transistors T11 and T12 as its basic constituents. These transistors T11 and T12 correspond to the differential transistors $T_{C1}$ and $T_{C2}$ in FIG. 13, respectively. The base of the transistor T11 is supplied with a predetermined input signal VI from a circuit, not shown, in the preceding stage of the high-speed logical integrated circuit apparatus. The base of the transistor T12 is supplied with a predetermined reference voltage VBB from a constant voltage generator, not shown, of a high-speed logical integrated circuit apparatus. Here, the input signal VI is set to be a digital signal having a relatively small signal amplitude as, for example, 0.8 V. The reference voltage VBB is set to the medium value, virtually, of the high level and the low level of the input signal VI.

Between the ground potential of the circuit and the collector of the transistor T11, there is provided a collector resistor R8 and, further, a P-channel MOSFET Q6 in parallel with the resistor R8. The gate of the MOSFET Q6 is coupled in common with the base of the transistor T11 and supplied with the input signal VI from a circuit, not shown, in the preceding stage of the high-speed logical integrated circuit apparatus. The MOSFET Q6 is designed to have its threshold voltage corresponding to the medium value, virtually, of the absolute values of the high level and the low level of the input signal VI. Thus, the resistor R8 and the MOSFET Q6 act as the variable impedance means ZV1 as shown in FIG. 13. Similarly, between the ground potential of the circuit and the collector of the transistor T12, there is provided, but not necessarily, a collector resistor R9 and, further, a P-channel MOSFET Q7 in parallel with the resistor R9. The gate of the MOSFET Q7 is supplied with the inverted output signal of the current switching circuit, i.e., the collector voltage $V_{C1}$ of the transistor T11. The MOSFET Q7 is designed to have its threshold voltage corresponding to the medium value, virtually, of the absolute values of the high level and the low level of the collector voltage $V_{C1}$. Hence, the resistor R9 and the MOSFET Q7 act as the variable impedance means ZV2 as shown in FIG. 13. The collector nodes of the differential transistors T11 and T12 are each coupled with stray capacitance $C_C$.

Meanwhile, between the emitters coupled in common of the differential transistors T11 and T12 an the power-supply voltage VEE, there are provided a transistor T13 and a resistor R10 corresponding to the transistor $T_S$ and the resister $R_S$ in FIG. 13, and the base of the transistor T13 is supplied with a predetermined constant voltage VS from a constant voltage generator, not shown, of the high-speed logical integrated circuit apparatus. Hence, the transistor T13 and the resistor R10 act as a constant current source supplying the current switching circuit with an operating current $I_S$ expressed as $$I_S \approx (VS - V_{BE}) / R10.$$

In the ECL circuit of this embodiment, the resistance value of the resistor R10 is set to be sufficiently large and the operating current $I_S$ of the current switching circuit is thereby made sufficiently small.

The noninverted output signal of the current switching circuit, i.e., the collector voltage $V_{C2}$ of the transistor T12, is transmitted to the noninverted output terminal VO1 of the ECL circuit through an output emitter follower circuit formed of a transistor T14 and a resistor R11. Needless to say, the transistor T14 and the resistor R11 correspond to the transistor $T_{D1}$ and the resistor $R_{D1}$ in FIG. 13, respectively. Similarly, the inverted output signal of the current switching circuit, i.e., the collector voltage $V_{C1}$ of the transistor T11, is transmitted to the inverted output terminal VO2 of the ECL circuit through another output emitter follower circuit formed of a transistor T15 and a resistor R12. Needless to say, the transistor T15 and the resistor R2 correspond to the transistor $T_{D2}$ and the resistor $R_{D2}$ in FIG. 13, respectively. The noninverted output terminal VO1 and inverted output terminal VO2 of the ECL circuit are further coupled with output-load capacitance $C_L$ due to input capacitance of the relative circuits in the subsequent stage and relative wiring capacitance.

When the input signal VI is changed to a level higher than the reference voltage VBB, the transistor T11 is brought to the on state and the pairing transistor T12 is brought to the cutoff state. Further, the MOSFET Q6 is turned off because the input signal VI is at the high level. Thereby, the operating current $I_S$ provided by the constant current source formed of the transistor T13 and the resistor R10, as it is, becomes the collector current $I_C$ of the transistor T11. Accordingly, the inverted output signal of the current switching circuit, i.e., the collector voltage $V_{C1}$ of the transistor T11, is brought to a predetermined low level expressed as $$V_{C1L} = I_C \times R8$$
$$\approx (VS - V_{BE})R8/R10.$$

Consequently, the inverted output signal VO2 of the ECL circuit goes to a low level expressed as $$VO2_L = V_{C1L} - V_{BE}$$
$$\approx (VS - V_{BE})R8/R10 - V_{BE}.$$

Meanwhile, because the transistor T12 is brought into the cutoff state, the noninverted output signal of the current switching circuit, i.e., the collector voltage $V_{C2}$ of the transistor T12, is brought to a high level expressed as $$V_{C2H} \approx 0.$$

Consequently, the noninverted output signal VO1 of the ECL circuit goes to a high level expressed as $$VO1_H = V_{C2H} - V_{BE}$$
$$\approx -V_{BE}.$$

When the collector voltage $V_{C1}$ is brought to the low level and the collector voltage $V_{C2}$ is brought to the high level as described above, the MOSFET Q7 constituting the variable impedance means ZV2 is brought into the on state. Therefore, the stray capacitance $C_C$ coupled with the collector node of the transistor T11 is actively discharged through the transistor T11 and the stray capacitance $C_C$ coupled with the collector node of the transistor T12 is actively charged through the MOSFET Q7. As a result, the transmission delay time of the change to the high level of the input signal VI to the ECL circuit is greatly shortened although the operating current of the ECL circuit including the current switching circuit is made sufficiently small.

When the input signal VI is changed to a level lower than the reference potential VBB, the transistor T11 is brought into the cutoff state, while the pairing transistor T12 is brought into the on state. Further, the MOSFET Q6 is turned on because the input signal VI is at the low level. Hence, the operating current $I_S$ provided by the constant current source formed of the transistor T13 and the resistor R10, as it is, becomes the collector current $I_C$ of the transistor T12. Accordingly, the inverted output signal of the current switching circuit, i.e., the collector voltage $V_{C1}$ of the transistor T11, goes to a high level expressed as $$V_{C1H} \approx 0.$$

Consequently, the inverted output signal VO2 of the ECL circuit is brought to a high level expressed as $$VO2_H = V_{C1H} - V_{BE}$$
$$\approx -V_{BE}.$$

Meanwhile, the noninverted output signal of the current switching circuit, i.e., the collector voltage $V_{C2}$ of the transistor T12, goes to a low level expressed as $$V_{C2L} = I_C \times R9$$
$$\approx (VS - V_{BE})R9/R10.$$

Consequently, the noninverted output signal VO1 of the ECL circuit goes to a low level expressed as $$VO1_L = V_{C2L} - V_{BE}$$
$$\approx (VS - V_{BE})R9/R10 - V_{BE}.$$

When the collector voltage $V_{C1}$ is brought to the high level and the collector voltage $V_{C2}$ is brought to the low level as described above, the MOSFET Q6 constituting the variable impedance means ZV1 is brought into the on state as described above. Therefore, the stray capacitance $C_C$ coupled with the collector node of the transistor T11 is actively charged through the MOSFET Q6 and the stray capacitance $C_C$ coupled with the collector node of the transistor T12 is actively discharged through the transistor T12. As a result, the transmission delay time of the change to the low level of the input signal VI to the ECL circuit is greatly shortened although the operating current of the ECL circuit including the current switching circuit is made sufficiently small.

In the present embodiment operating as described above, the power consumption of the ECL circuit can be reduced without impairing the high-speed operation of the circuit and, in addition, higher degree of circuit integration and lower power consumption of the high-speed logical integrated circuit apparatus mounting such ECL circuit thereon can be promoted.

Evaluation of Logic Circuit

Figure 15:
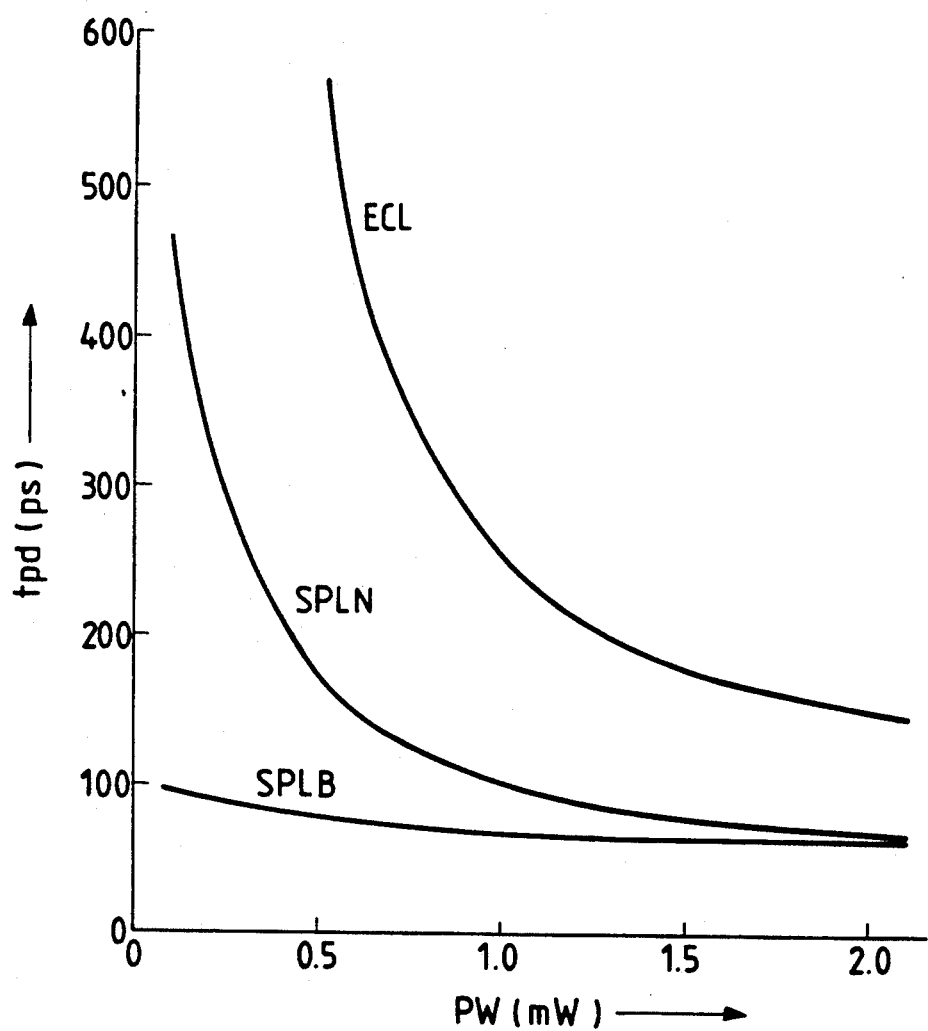
FIG. 15 is a characteristic curve showing relationships between power consumption per gate of various logic circuits and transmission delay times.
Figure 16:
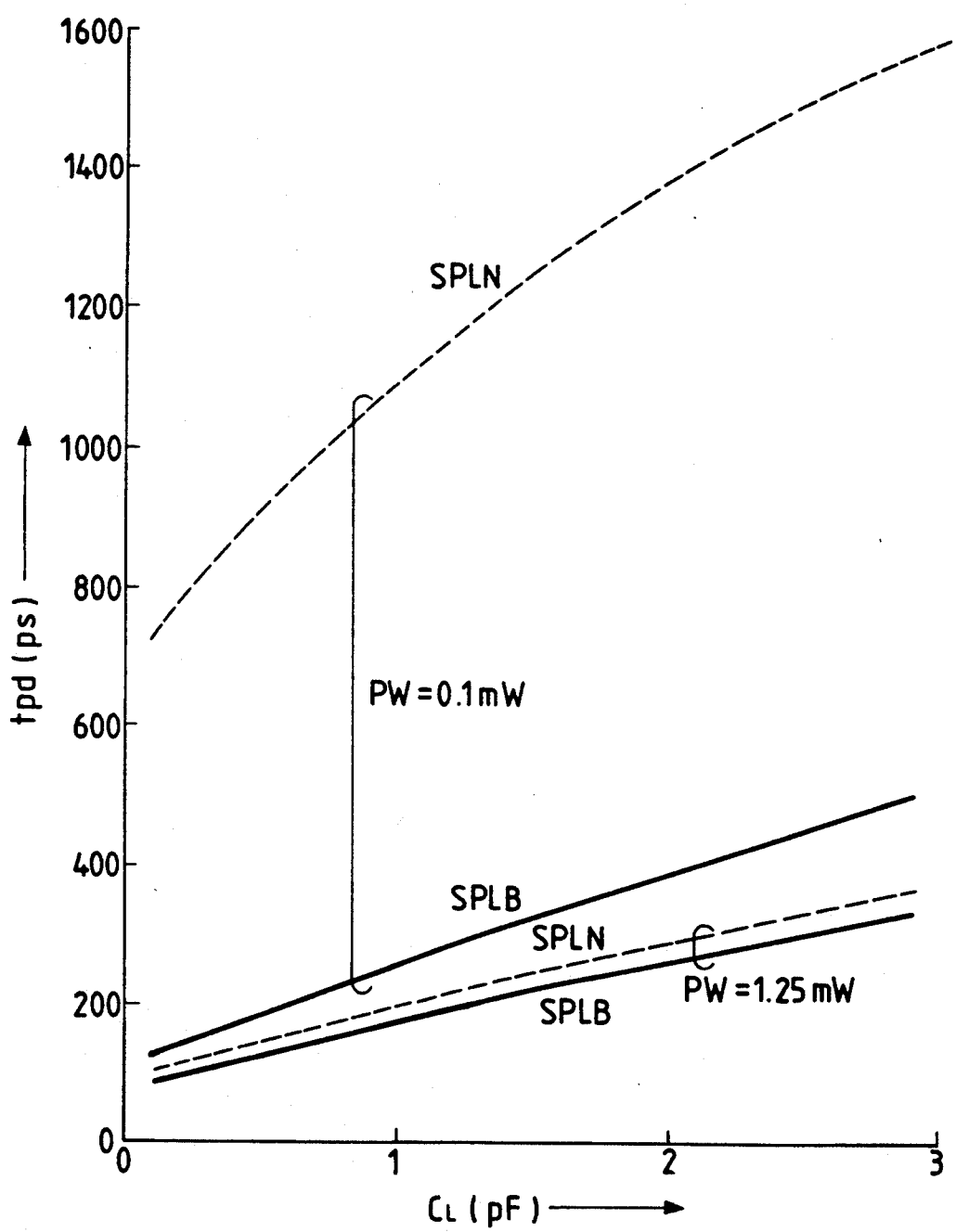
FIG. 16 is a characteristic curve showing relationships between electrostatic capacity of the output-load capacitance of various logic circuits and transmission delay times.

FIG. 15 shows an example of characteristic curves showing relationships between the power consumption per gate of various logic circuits and the transmission delay time. FIG. 16 shows an example of characteristic curves showing relationships between the electrostatic capacity of the output-load capacitance of various logic circuits and the transmission delay time. The transmission characteristics of the logic circuits to which the present invention is applied will be evaluated on the basis of these characteristic curves. The results in FIG. 15 and FIG. 16 are that obtained as the results of computer simulation In FIG. 15, the power consumption PW per gate is shown along the X-axis in units of mW (milliwatt) and the transmission delay time tpd is shown along the Y-axis in units of ps (picosecond). In FIG. 16, the electrostatic capacity of the output-load capacitance $C_L$ is shown along the X-axis in units of pF (picofarad) and the transmission delay time tpd is shown along the Y-axis in units of ps (picosecond). In FIG. 15 and FIG. 16, the SPL circuit with the present invention applied thereto is indicated as SPLB and the SPL circuit and the ECL circuit without the present invention applied thereto are indicated as SPLN and ECL, respectively.

Figure 21:
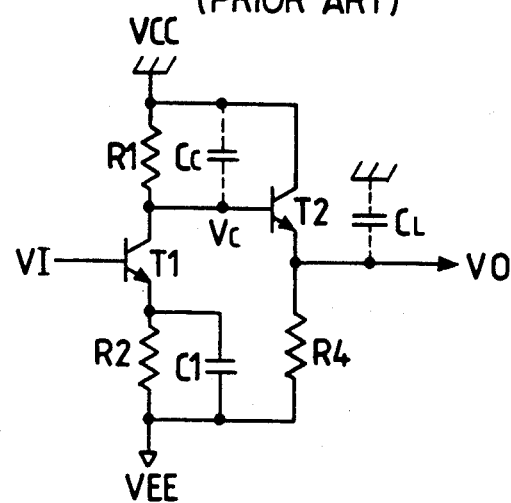
FIG. 21 is a circuit diagram showing an example of a conventional NTL circuit.
Figure 22:
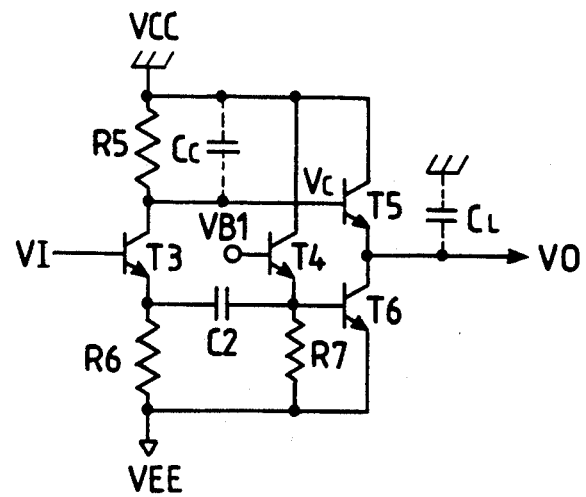
FIG. 22 is a circuit diagram showing an SPL circuit considered prior to the present invention.

In the case of the SPL circuit (SPLN) without the present invention applied thereto shown in FIG. 15, the transmission delay time tpd can be shortened by decreasing the resistance values, for example, of the resistors R1 and R2 shown in FIG. 21, thereby increasing the power consumption per gate PW. However, if the resistance values of the resistors R1 and R2 are increased to thereby decrease the power consumption per gate PW to 0.1 mW or thereabout, for example, the delay in the rise of the collector voltage $V_C$ due to the collector stray capacitance $C_C$ becomes greater and the transmission delay time tpd is increased to around four times. Therefore, it becomes difficult to achieve the reduction in the power consumption while keeping the high-speed logical integrated circuit apparatus capable of high-speed operation. The same thing holds also in the ECL circuit, in which the necessary power consumption per gate PW to attain a desired transmission delay time tpd becomes larger than in the SPL circuit without the present invention applied thereto.

In the case of the SPL circuit (SPLB) with the present invention applied thereto, however, the transmission delay time tpd of the SPL circuit does not increase substantially even if the power consumption per gate PW is decreased to 0.1 mW or thereabout by increasing the resistance values of the collector resistor R5 and the resistor R6 shown in FIG. 8.

Then, if attention is paid to the relationship between the electrostatic capacity of the output-load capacitance $C_L$ and the transmission delay time tpd, there is no substantial difference between the transmission delay time tpd in the SPL circuit (SPLN) without the present invention applied thereto and the transmission delay time tpd in the SPL circuit (SPLB) with the present invention applied thereto when the power consumption per gate PW is made as large as 1.25 mW, as illustrated in FIG. 16. However, when the power consumption per gate PW is lowered to 0.1 mW, for example, the transmission delay time tpd in the SPL circuit without the present invention applied thereto becomes four times or above as large as the transmission delay time tpd in the SPL circuit with the present invention applied thereto, and this difference becomes greater as the electrostatic capacity of the output-load capacitance $C_L$ increases.

Thus, with the SPL circuit to which the present invention is applied, it is made possible to reduce the operating current without impairing its high-speed operation and, accordingly, to attain higher degree of integration of the circuit elements. Consequently, higher degree of circuit integration and reduction in the power consumption of the high-speed logical integrated circuit apparatus including such SPL circuit as its constituent can be attained and, further, miniaturization and reduction in the power consumption of a high-speed computer or the like constituted of such high-speed logical integrated circuit apparatus can be attained while keeping the machine cycle thereof short.

Examples of Circuits Including Logic Circuits

Figure 17:
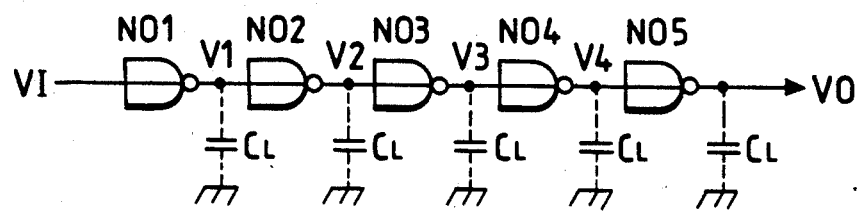
FIG. 17 is a circuit diagram showing an embodiment of a series circuit formed of logic circuits to which the present invention is applied.
Figure 18:
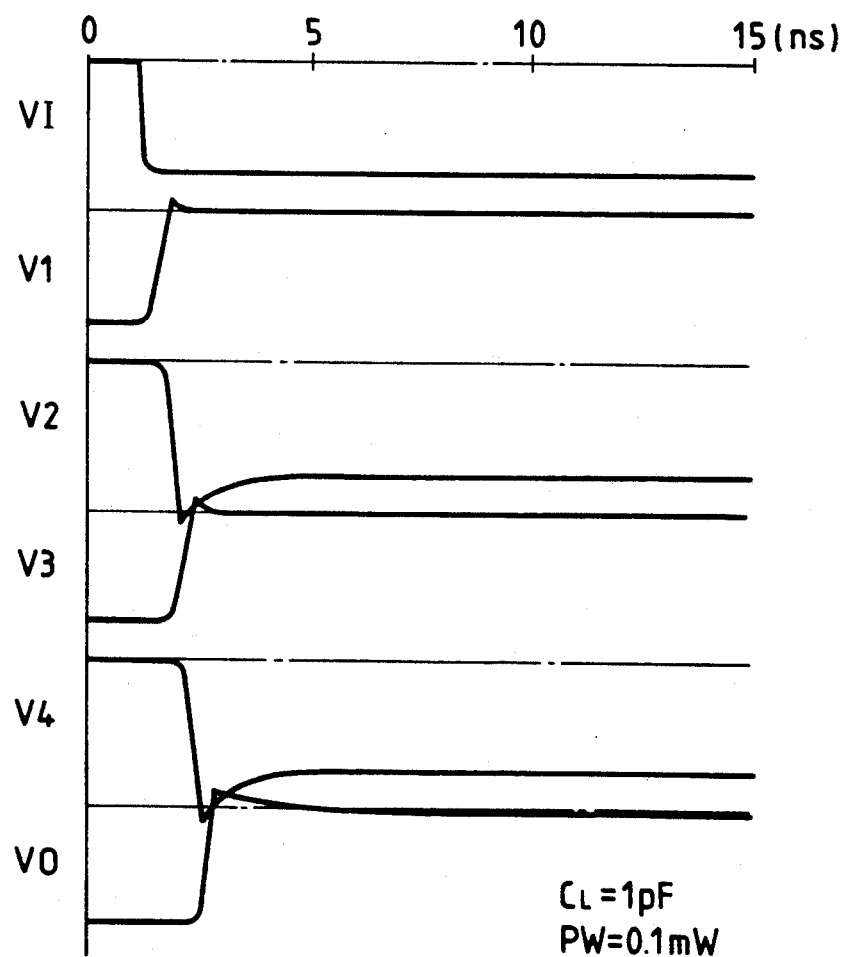
FIG. 18 is a signal waveform diagram showing an example of the series circuit of FIG. 17.
Figure 25:
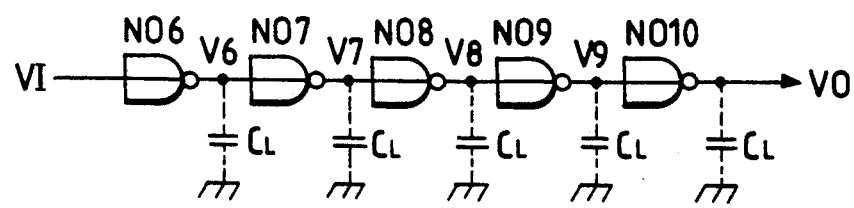
FIG. 25 is a circuit diagram showing an example of a series circuit formed of conventional logic circuits.
Figure 26:
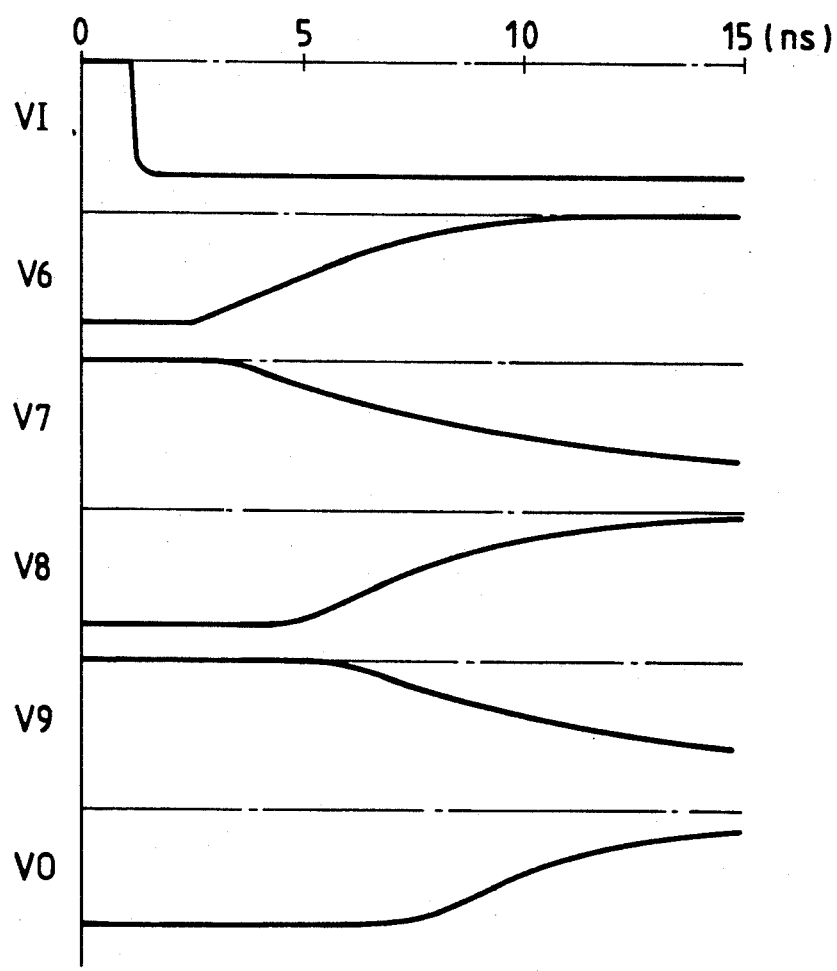
FIG. 26 is a waveform diagram showing an example of the series circuit of FIG. 25.

FIG. 17 shows a circuit diagram of an embodiment of a series circuit formed of logic circuits with the present invention applied thereto and FIG. 18 shows a relative signal waveform diagram. Further, FIG. 25 shows an example of a series circuit formed of conventional logic circuits and FIG. 26 shows a diagram of relative signal waveforms. Structure of the example of the circuit including logic circuits with the present invention applied thereto and characteristics thereof will be described on the basis of these diagrams. The series circuit according to the present invention is, but not necessarily, included in a high-speed logical integrated circuit apparatus forming a high-speed computer or the like, as its constituent. The signal waveforms shown in FIG. 18 and FIG. 26 are that obtained as the results of computer simulation, in which the output-load capacitance $C_L$ of each NOR gate circuit and the power consumption per gate PW are set to 1 pF and 0.1 mW, respectively.

Referring to FIG. 17, the series circuit according to the present embodiment is, but not necessarily, constituted of five NOR gate circuits No. 1 to No. 5 connected in series. The input terminal of the NOR gate circuit No. 1 is supplied with an input signal VI from a circuit, not shown, in the preceding stage of the high-speed logical integrated circuit apparatus. The output signal V1 of the NOR gate circuit No. 1 is supplied to the input terminal of the NOR gate circuit No. 2 in the subsequent stage. Similarly, the output signal V2 of the NOR gate circuit No. 2 is supplied to the input terminal of the NOR gate circuit No. 3, and the output signal V3 thereof is supplied to the input terminal of the NOR gate circuit No. 4. The output signal V4 of the NOR gate circuit No. 4 is supplied to the input terminal of the NOR gate circuit No. 5 in the final stage and the output signal thereof is supplied to a circuit, not shown, in the subsequent stage of the high-speed logical integrated circuit apparatus, as the output signal VO of the series circuit.

In the present embodiment, the NOR gate circuits No. 1 to No. 5 have the circuit configuration basically following the NTL circuit shown in FIG. 7, the SPL circuit shown in FIG. 8 to FIG. 11, or the ECL circuit shown in FIG. 14. Accordingly, the transmission delay time of each NOR gate circuit is greatly shortened in spite of the fact that its operating current is greatly reduced and lower power consumption thereof is attained. Therefore, in the series circuit formed of the conventional logic circuits, the output signals V1 to V4 of the successive NOR gate circuits and the output signal VO of the series circuit are each delayed by 1 ns or more and there is totally produced a transmission delay close to 10 ns as illustrated in FIG. 26, but the delay in each of the NOR gate circuit formed of the logic circuits with the present invention applied thereto is reduced to around one fifth and the total delay is reduced to 1 to 2 ns as illustrated in FIG. 18.

Such effects are equally obtained from circuits of other combination, other arithmetic and logic circuits, and the like. Consequently, the machine cycle in high-speed computers and the like constituted of the high-speed logical integrated circuit apparatus can shortened and miniaturization of the apparatus can be promoted.

Figure 19:
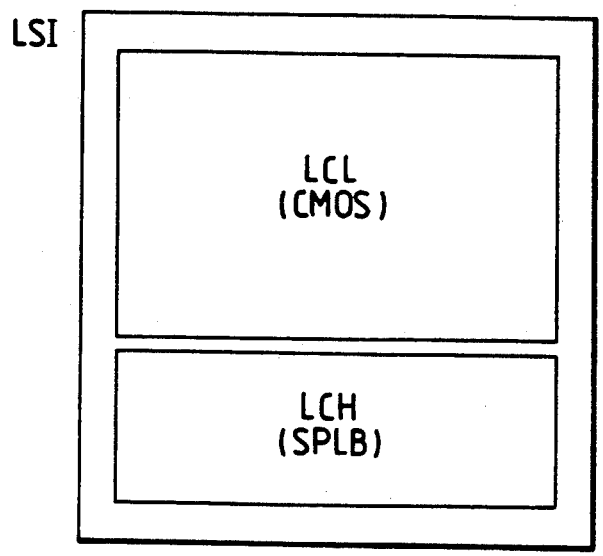
FIG. 19 is a board layout diagram showing an embodiment of a high-speed logical integrated circuit apparatus to which the present invention is applied.
Figure 20:
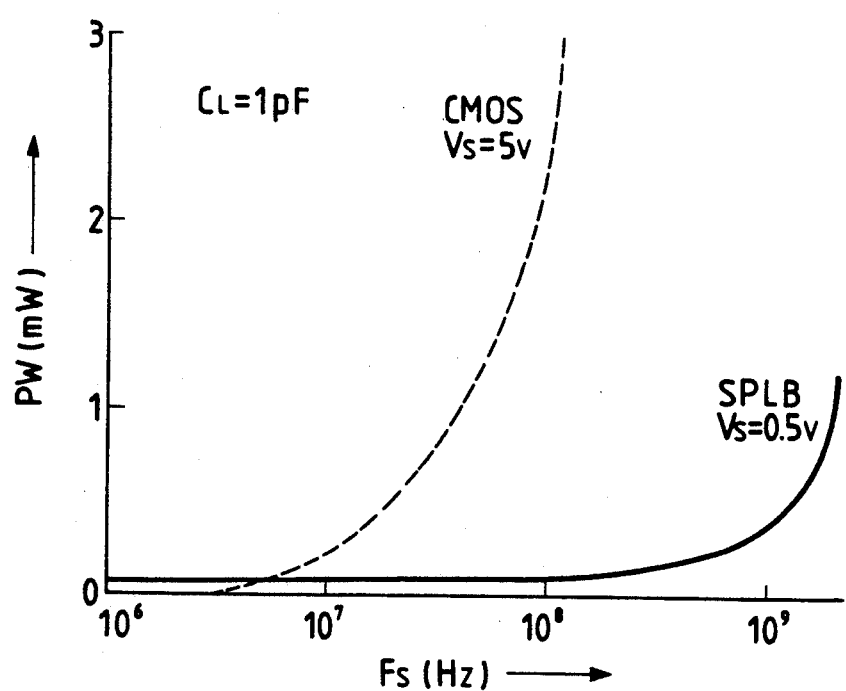
FIG. 20 is a characteristic curve showing relationships between switching frequencies of the various logic circuits included in the high-speed logical integrated circuit apparatus of FIG. 19 and power consumption per gate.

High-speed Logical Integrated Circuit device Formed of Various Kinds of Logic Circuits and Their Evaluation FIG. 19 shows a substrate layout diagram of an embodiment of a high-speed logical integrated circuit apparatus to which the present invention is applied. FIG. 20 shows characteristic curves showing relationships between the switching frequency of each logic circuit included in the high-speed logical integrated circuit apparatus and the power consumption per gate. In FIG. 20, the switching frequency $F_S$, i.e., the frequency of the digital signal transmitted through each logic circuit, is indicated along the X-axis in units of Hz (hertz) and the power consumption per gate PW is indicated along the Y-axis in units of mW (milliwatt). The SPL circuit with the present invention applied thereto is indicated as SPLB and a conventional CMOS (complementary MOS) circuit is indicated as CMOS. The characteristic curves shown in FIG. 20 are that obtained as the results of computer simulation, in which the output-load capacitance $C_L$ of each NOR gate circuit is set to 1 pF, and the amplitude $V_S$ of the transmitted digital signal is set to 5 V for the CMOS circuit and to 0.5 V for the SPL circuit.

Referring to FIG. 19, the high-speed logical integrated circuit apparatus according to the present embodiment includes, but not necessarily, a logic portion LCH formed of an SPL circuit (a first logic circuit) and a logic portion LCL formed of a CMOS circuit (a second logic circuit). The logic portion LCH and logic portion LCL are, but not necessarily, formed on one chip by known semiconductor circuit integrating techniques. Out of them, the logic portion LCH is arranged to be that transmitting a signal of relatively high frequency such as the clock system circuit in a high-speed computer, and formed, but not necessarily, of the new SPL circuit (SPLB) as shown in FIG. 8 to FIG. 11. On the other hand, the logic portion LCL is arranged to be that transmitting a signal of relatively low frequency and formed of a conventional CMOS circuit made up of P-channel MOSFETs and N-channel MOSFETs disposed in a series-parallel array.

The power consumption per gate PW necessary for a logic circuit is generally obtained by a calculating formula $$PW = C_L V_S^2 F_S + PW_S,$$

where $C_L$ represents the output-load capacitance $V_S$ and $F_S$ respectively represent the signal amplitude and the switching frequency of the digital signal transmitted, and $PW_S$ represents the power consumption at the time when each logic circuit is at its stationary state. Therefore, as illustrated in FIG. 20, the power consumption per gate PW required by a CMOS circuit CMOS) is only 0.1 mW or below when the switching frequency $F_S$ is 10 MHz (MHz: $10^6$ hertz) or below, but it sharply increases as the switching frequency $F_S$ exceeds 10 MHz. However, since the CMOS circuit, as well known, can be constructed of only MOSFETs which can be miniaturized relatively easily, the layout area per gate can be made smaller. On the other hand, in the case of the SPL circuit (SPLB), since the signal amplitude $V_S$ is smaller and the power consumption $PW_S$ in the stationary state is extremely small, the dependency on frequency of the necessary power consumption per gate PW becomes very small and it remains around 0.1 mW until the switching frequency $F_S$ exceeds 1 GHz (GHz: $10^9$ hertz). On the contrary, however, the power consumption per gate PW becomes larger than that in the CMOS circuit when the switching frequency $F_S$ becomes around 10 MHz or below. Further, since the SPL circuit is a circuit combined with bipolar transistors, it requires larger layout area than that of the CMOS circuit.

In the high-speed logical integrated circuit apparatus according to the present embodiment, the logic portion LCH for transmitting a digital signal with a relatively high frequency as close to 1 GHz, for example, is structured of a new SPL circuit and the logic portion LCL for transmitting a digital signal with a relatively low frequency as 10 MHz or below, for example, is structured of a conventional CMOS circuit. Therefore, in the logic portion LCH, lower power consumption is attained while securing relatively high switching frequencies, and in the logic portion LCL, lower power consumption is attained while securing desired switching speeds and higher degree of circuit integration. Consequently, while overall transmission characteristics of the high-speed logical integrated circuit apparatus are enhanced, higher degree of circuit integration and lower power consumption thereof can be attained.

As shown in the above described embodiments, by applying the present invention to such logic circuits as NTL circuits, SPL circuits, and ECL circuits, and, further, to high-speed logical integrated circuit apparatus comprising such logic circuits a basic constituents, the following performances and effects can be obtained.

(1) By providing, as the collector load of an input transistor constituting a phase divider circuit or a current switching circuit for an NTL circuit, an SPL circuit, and an ECL circuit, a variable impedance means, which is formed of a means for setting a predetermined level and a switching means connected in parallel with the level setting means and adapted to be selectively brought into the on state according to an input signal, and of which the impedance is selectively varied in accordance with the level of the input signal, such an effect is obtained that charging and discharging operations of the stray capacitance coupled with the collector node of the transistor can be speeded up.

(2) In the point (1) above, by forming the level setting means with a collector resistor having a relatively high resistance value, a diode having a predetermined forward voltage, or a circuit having such collector resistor and diode connected in series, and by forming the switching means with a P-channel MOSFET having its threshold voltage being corresponding to the medium value, virtually, of absolute values of the logical amplitude of the input signal, such an effect is obtained that the variable impedance means can be easily obtained while having its layout area kept small.

(3) In the points (1) and (2) above, by increasing the resistance value of the emitter load for setting the operating current of the transistor and by having a speed-up capacitor load connected in parallel with the emitter resistor, such an effect is obtained that the operating current of the phase divider circuit and the current switching circuit can be decreased without increasing the transmission delay time.

(4) By the effects mentioned in the points (1) to (3) above, such an effect is obtained that the operating currents of the NTL circuit, SPL circuit, ECL circuit, etc. can be largely reduced without impairing their fast operations.

(5) By the effects mentioned in the points (1) to (4) above, such an effect is obtained that higher degree of circuit integration and lower power consumption of high-speed logical integrated circuit apparatus constructed with the NTL circuit, SPL circuit, and the ECL circuit as its basic constituent can be attained while maintaining their fast operations unchanged.

(6) By the effects mentioned in the points (1) to (5) above, such an effect is obtained that miniaturization and reduction in power consumption of high-speed computers or the like formed of high-speed logical integrated circuit apparatus can be attained with the machine cycle kept short.

(7) In semiconductor integrated circuit apparatus such as high-speed logical integrated circuit apparatus, by having the logic portion in which a digital signal with a relatively high frequency is transmitted constructed with the NTL circuit, SPL circuit, or the ECL circuit, and the portion in which a digital signal constructed with a relatively low frequency is transmitted with a CMOS circuit, such an affect is obtained that lower power consumption of each logic portion can be attained with the transmission delay time kept short.

(8) In the point (7) above, by providing a variable impedance means, of which the impedance is selectively varied according to the level of the input signal, as the collector load of an input transistor constituting a phase divider circuit or a current switching circuit for an NTL circuit, an SPL circuit, and an ECL circuit, high-speed charging and discharging operations of the collector stray capacitance of the transistor can be performed at high speed, and therefore, such an effect is obtained that reduction in the power consumption of each logic circuit can be promoted while the circuit operations are made faster.

(9) By the effects mentioned in the points (7) and (8) above, such an effect is obtained that higher degree of circuit integration and lower power consumption of high-speed logical integrated circuit apparatus and the like can be attained while achieving faster overall operations.

(10) By the effects mentioned in the points (7) to (9) above, an effect is obtained that miniaturization and reduction in power consumption of high-speed computers or the like formed of high-speed logical integrated circuit apparatus can be attained while achieving shorter machine cycle.

Although the invention made by the present inventors have been particularly described above as related to its embodiments, it is to be understood that the present invention is not limited to the above described embodiments but various modifications can be made without departing from the scope of the invention. For example, in FIG 1 to FIG. 6 and FIG. 13, the signal amplitudes, and their absolute values, of the input signal VI, output signal VO, or VO1 and VO2, can be arbitrarily set and particular configurations of the variable impedance means ZV, or ZV1 and ZV2, level setting means LS, and switching means SW can be made in various ways. The diode $D_C$ shown in FIG. 4 and FIG. 5 need not necessarily be a zener diode. In FIG. 7 to FIG. 11 and FIG. 14, the particular voltage values of the power-supply voltages VCC and VEE are not limited to the values used in the described embodiments and particular circuit configurations and logic structures of the logic circuits can be embodied in various ways. More specifically, the input transistor T1 in FIG. 7, for example, may be replaced with a plurality of input transistors connected in parallel the same as in FIG. 10. In that case, a plurality of P-channel MOSFETs connected in series must be provided instead of the P-channel MOSFET Q1. In FIG. 8 to FIG. 10, the SPL circuit may be that provided with a circuit for clamping the base potential of the transistor T6. Further, in FIG. 14, the input transistor T11 may be replaced with a plurality of transistors depending on the logical structure of the ECL circuit, or it may be that outputting only the non-inverted or the inverted output signal. In FIG. 17, the series circuit can take various logical structures or can be constructed with other logic gate circuits than the NOR gate circuits. In FIG. 19, the high-speed logical integrated circuit apparatus may be divided into more than two logic portions, and the logic portion LCH of the high-speed logical integrated circuit apparatus may be that including an NTL circuit and an ECL circuit.

While the foregoing description has been chiefly made of the cases where the invention made by the inventors is applied to NTL circuits, SPL circuits, and ECL circuits and, further, to high-speed logical integrated circuit apparatus using such logic circuits as basic constituents thereof and constituting high-speed computers, to which the present invention has been directed, the present invention is not limited thereto. For example, it can be applied to various logic circuits basically following the above described logic circuits, gate array integrated circuits using such logic circuits as basic constituents thereof, and various digital processing apparatus formed of such high-speed logical integrated circuit apparatus and gate array integrated circuits. The present invention can be widely applied to logic circuits including, at least, a phase divider circuit or current switching circuit, and to semiconductor integrated circuit apparatus including such logic circuits.

Effects obtained by representative aspects of the present invention disclosed herein will be briefly described below. By providing a variable impedance means, formed, for example, of a collector resistor having a relatively large resistance value and a p-channel MOSFET, which is connected in parallel with the collector resistor, has its gate supplied with an input signal, and has its threshold voltage corresponding to the medium value of the absolute values of the logical amplitude of the input signal, as the collector load of an input transistor constituting a phase divider circuit or a current switching circuit of an NTL circuit, SPL circuit, ECL circuit, and the like, charging and discharging operations of the collector stray capacitance of the input transistor can be speeded up, and hence, it is made possible to attain lower power consumption of the NTL circuit, SPL circuit, ECL circuit, and the like, without impairing high-speed operations of the circuit. Consequently, higher degree of circuit integration and lower power consumption of the high-speed logical integrated circuit apparatus and the like using such logic circuits as basic constituents thereof can be promoted and, further, the machine cycle of the high-speed computers and the like formed of such high-speed logical integrated circuit apparatus can be shortened.

What is claimed is:

1. A logic circuit comprising:
   a phase divider current which receives an input signal at an input thereof and outputs inverted and non-inverted output signals at first and second outputs thereof, respectively, said phase divider circuit including:
      a first, bipolar transistor having a base coupled to said input and a collector-emitter path coupled between said first and second outputs,
      variable impedance means coupled to said first output and for providing variable voltage levels to said first output, and
      a load element coupled to said second output;
   a second transistor coupled to an output terminal of said logic circuit and for receiving said inverted output signal; and
   an active pull-down circuit coupled to said output terminal and for receiving the non-inverted output signal,
   wherein said variable impedance means has an impedance which varies in accordance with a level of said input signal.

2. A logic circuit according to claim 1, wherein said variable impedance means includes a third transistor coupled to said first output and for receiving said input signal.

3. A logic circuit according to claim 2, wherein said variable impedance means further includes an impedance element coupled in parallel with said third transistor.

4. A logic circuit according to claim 3, wherein said impedance element is a resistor element.

5. A logic circuit according to claim 1, wherein said logic circuit is formed on a semiconductor substrate.

6. A logic circuit according to claim 1, wherein said first and second transistors are an NPN type bipolar transistors.

7. A logic circuit comprising:
   a first power-supply terminal supplied with a first power-supply voltage;
   a second power-supply terminal supplied with a second power-supply voltage;
   a bipolar transistor having a base coupled to receive an input signal, a collector and an emitter;
   level setting means coupled between said first power-supply terminal and the collector of said bipolar transistor and for determining a voltage level of a node at the coupling of the collector of said bipolar transistor and the level setting means, by providing current thereto when said bipolar transistor is brought, substantially, into an on state;
   switching means provided in parallel with said level setting means; and
   emitter load means coupled between the emitter of said bipolar transistor and said second power-supply terminal,
   wherein the switching means is brought into an off state when said bipolar transistor is brought, substantially, into the on state, and said switching means is brought into an on state when said bipolar transistor is brought, substantially, into a cutoff state.

8. A logic circuit according to claim 7, wherein said level setting means includes a resistor.

9. A logic circuit according to claim 7, wherein said level setting means includes a diode.

10. A logic circuit according to claim 7, wherein said level setting means includes a diode and a resistor connected in series with said diode.

11. A logic circuit according to claim 7, wherein said bipolar transistor includes an NPN type bipolar transistor and said switching means includes a P-channel MOSFET having a gate coupled to receive said input signal, a source coupled to said first power-supply terminal and a drain coupled to the collector of said bipolar transistor.

12. A logic circuit according to claim 11, wherein said P-channel MOSFET has a threshold voltage corresponding to the average value, approximately, of absolute values of the logical amplitude of said input signal.

13. A logic circuit according to claim 7, wherein said logic circuit is a non-threshold logic (NTL) circuit and further comprises a speed-up capacitor connected in parallel with said emitter load means of said bipolar transistor.

14. A logic circuit according to claim 7, wherein said logic circuit is a super push-pull logic (SPL) circuit and further comprises a speed-up capacitor connected in parallel with said emitter load means of said bipolar transistor.

15. A logic circuit according to claim 7, wherein said logic circuit is an ECL circuit.

16. A logic circuit according to claim 7, wherein said logic circuit is included in a logical integrated circuit device.

17. A logic circuit according to claim 16, wherein said logical integrated circuit device further comprises a CMOS circuit, wherein said logic circuit and said CMOS circuit are selectively used according to the frequency of transmitted signals.

18. A logic circuit according to claim 17, wherein said logical integrated circuit device is comprised of a computer.

19. A semiconductor integrated circuit device comprising a first and a second logic circuit selectively used according to the frequency of transmitted signals, wherein said first logic circuit comprises at least one of a non-threshold logic (NTL) circuit, a super push-pull logic (SPL) circuit, and an ECL circuit, and said second logic circuit is a CMOS circuit.

20. A semiconductor integrated circuit device according to claim 19, wherein each one of said at least one of said NTL circuit, SPL circuit, and ECL circuit comprises an input bipolar transistor, an emitter load means of said input bipolar transistor, and a variable impedance means coupled to an emitter-collector path of said input bipolar transistor, wherein said variable impedance means has an impedance which is selectively varied in accordance with a level of an input signal.

21. A semiconductor integrated circuit device according to claim 20, wherein said variable impedance means comprises a resistor provided between a first power-supply terminal supplied with a first power-supply voltage and a collector of said input bipolar transistor and a P-channel MOSFET connected in parallel with said resistor and supplied with said input signal at its gate.

22. A logic circuit comprising:
an input terminal supplied with an input signal;
an output terminal supplied with an output signal;
a first and a second power-supply terminal respectively supplied with a first and a second power-supply voltage;
a bipolar transistor having its base coupled with said input terminal and its collector coupled with said output terminal;
variable impedance means coupled between said first power-supply terminal and the collector of said bipolar transistor and controlled such that the impedance thereof has a first value when said bipolar transistor is brought, substantially, into an on state and the impedance thereof has a second value lower than said first value when said bipolar transistor is brought, substantially, into a cutoff state; and
emitter load means coupled between the emitter of said bipolar transistor and said second power-supply terminal.

23. A logic circuit comprising:
an input terminal supplied with an input signal;
an output terminal supplied with an output signal;
first and second power-supply terminals supplied with first and second power-supply voltages, respectively;
first and second nodes;
an input bipolar transistor having a base coupled to said input terminal, a collector coupled to said first node and an emitter coupled to said second node;
a first bipolar transistor having a base coupled to said first node, an emitter coupled to said output terminal and a collector coupled to said first power-supply terminal;
variable impedance means coupled between said first power-supply terminal and said first node and having a first impedance value when said input bipolar transistor is brought, substantially, into an on state and having a second impedance value lower than said first impedance value when said input bipolar transistor is brought, substantially, into a cutoff state;
emitter load means coupled between said second node and said second power-supply terminal; and
discharging means coupled between said output terminal and said second power-supply terminal and for discharging an output-load capacitance of said output terminal,
wherein said variable impedance means determines a voltage level of said first node by providing current thereto when said input bipolar transistor is brought into the on state, and
wherein said variable impedance means has an impedance which is varied in accordance with said input signal.

24. A logic circuit according to claim 23, wherein said variable impedance means comprises:
a MOSFET having a gate coupled to said input terminal and to receive said input signal and having a source-drain path coupled between said first power-supply terminal and said first node; and
an impedance element coupled between said first power-supply terminal and said first node.

25. A logic circuit according to claim 24, wherein said impedance element comprises a resistor.

26. A logic circuit according to claim 25, wherein said emitter load means comprises a resistor.

27. A logic circuit according to claim 26, wherein said discharging means comprises a resistor.

28. A logic circuit according to claim 27, further comprising:
a capacitor coupled between said second node and said second power-supply terminal.

29. A logic circuit according to claim 26, further comprising:
a third node;
a second bipolar transistor having a base supplied with a predetermined voltage, a collector coupled to said first power-supply terminal and an emitter coupled to said third node;
a capacitor coupled between said second node and said third node; and
a resistor coupled between said third node and said second power-supply terminal,
wherein said discharging means comprises a third bipolar transistor having a base coupled to said third node, a collector coupled to said output terminal, and an emitter coupled to said second power-supply terminal.

30. A logic circuit according to claim 29, wherein said MOSFET is a P-channel type MOSFET, and wherein said first, second, third and input bipolar transistors are of an NPN type, respectively.

31. A logic circuit according to claim 29, further comprising:
another input terminal supplied with another input signal, respectively; and another input bipolar transistor coupled between said first node and said second node, wherein a base of said another input bipolar transistor is coupled to said another input terminal, wherein said variable impedance means further comprises another MOSFET coupled in series with said MOSFET and having a gate coupled to said another input terminal.

32. A logic circuit according to claim 31, wherein said MOSFET and said another MOSFET are of a P-channel type, respectively, and wherein said first to third bipolar transistors, said input bipolar transistor and said another input bipolar transistor are of an NPN type, respectively.

33. A logic circuit comprising:

an input terminal supplied with an input signal;

a first output terminal supplied with a first output signal;

a second output terminal supplied with a second output signal;

first and second power-supply terminals supplied with first and second power-supply voltages, respectively;

first, second and third nodes;

an input bipolar transistor having a base coupled to said input terminal, a collector coupled to said first node and an emitter coupled to said second node;

a first bipolar transistor having a base coupled to said first node, an emitter coupled to said first output terminal and a collector coupled to said first power-supply terminal;

a second bipolar transistor having a base coupled to receive a predetermined voltage and a collector-emitter path coupled between said second node and said third node;

a third bipolar transistor having a base coupled to said third node, an emitter coupled to said second output terminal and a collector coupled to said first power-supply terminal;

first variable impedance means coupled between said first power-supply terminal and said first node and having a first impedance value when said input bipolar transistor is brought into an on state and having a second impedance value lower than said first impedance value when said input bipolar transistor is brought into a cutoff state;

second variable impedance means coupled between said first power-supply terminal and said third node and having a third impedance value when said second bipolar transistor is brought into an on state and having a fourth impedance value lower than said third impedance value when said second bipolar transistor is brought into a cutoff state;

first discharging means coupled between said first output terminal and said second power-supply terminal and for discharging a first output-load capacitance associated with said first output terminal;

second discharging means coupled between said second output terminal and said second power-supply terminal and for discharging a second output-load capacitance associated with said second output terminal; and a current source coupled between said second node and said second power-supply terminal, wherein said first variable impedance means determines a voltage level of said first node by providing current thereto when said input bipolar transistor is brought into the on state, wherein said second variable impedance means determines a voltage level of said third node by providing current thereto when said second bipolar transistor is brought into an on state, and wherein said first variable impedance means has an impedance which is varied in accordance with said input signal.

34. A logic circuit according to claim 33, wherein said first variable impedance means comprises:

a first MOSFET having a gate coupled to said input terminal and to receive said input signal and having a source-drain path coupled between said first power-supply terminal and said first node, and a first resistor coupled between said first power-supply terminal and said first node; and wherein said second variable impedance means comprises:

a second MOSFET having a gate coupled to said first node and a source-drain path coupled between said first power-supply terminal and said third node, and a second resistor coupled between said first power-supply terminal and said third node.

35. A logic circuit according to claim 34, wherein said current source comprises a third resistor coupled between said second node and said second power-supply terminal and a fourth bipolar transistor having a base coupled to receive another predetermined voltage and collector-emitter path coupled between said second node and said fourth resistor.

36. A logic circuit according to claim 35, wherein said first discharging means comprises a resistor, and wherein said second discharging means comprises a resistor.

37. A logic circuit according to claim 36, wherein said first to fourth bipolar transistors and said input bipolar transistor are of an NPN type, and wherein said first and second MOSFETs are of a P-channel type.

* * * * *